United States Patent [19]
Tamaki et al.

[11] Patent Number: 4,949,162
[45] Date of Patent: Aug. 14, 1990

[54] SEMICONDUCTOR INTEGRATED CIRCUIT WITH DUMMY PEDESTALS

[75] Inventors: Yoichi Tamaki, Kokubunji; Kiyoji Ikeda, Hachioji; Toru Nakamura, Tanashi; Akihisa Uchida, Tachikawa; Toru Koizumi, Tachikawa; Hiromichi Enami, Tachikawa; Satoru Isomura; Shinji Nakajima, both of Hamura; Katsumi Ogiue, Hinode; Kaoru Ohgaya, Ohme, all of Japan

[73] Assignee: Hitachi, Ltd., Tokyo, Japan

[21] Appl. No.: 201,928

[22] Filed: Jun. 3, 1988

[30] Foreign Application Priority Data

Jun. 5, 1987 [JP] Japan .................................. 62-139907
Mar. 4, 1988 [JP] Japan .................................. 63-50642
Mar. 4, 1988 [JP] Japan .................................. 63-50643
Mar. 4, 1988 [JP] Japan .................................. 63-50644
Apr. 20, 1988 [JP] Japan .................................. 63-98816

[51] Int. Cl.$^5$ ........................................ H01L 23/48
[52] U.S. Cl. ........................................ 357/71; 357/40; 357/43; 357/35; 357/54; 357/45
[58] Field of Search ................... 357/59 H, 54, 35, 47, 357/49, 59 J, 59 F, 40, 71, 34, 23.5, 43, 41, 65, 45

[56] References Cited

U.S. PATENT DOCUMENTS

| | | | |
|---|---|---|---|
| 3,667,008 | 5/1979 | Katnick | 357/35 X |
| 4,663,831 | 5/1987 | Birritella et al. | 357/35 X |
| 4,673,969 | 6/1987 | Ariizumi et al. | 357/59 J X |
| 4,710,794 | 12/1987 | Koshino et al. | 357/49 |
| 4,725,874 | 2/1988 | Ooga et al. | 357/47 X |
| 4,748,489 | 5/1988 | Komatsu | 357/49 X |

FOREIGN PATENT DOCUMENTS 0561556 1/1981 Japan.
61-276345 12/1986 Japan.

Primary Examiner—William Mintel
Attorney, Agent, or Firm—Antonelli, Terry, Stout & Kraus

[57] ABSTRACT

A multilayer semiconductor integrated circuit having a plurality of wiring layers in which at least the lines of a lower layer are extended on wiring channel regions arranged in a grid. Dummy pedestals are formed of the same conductive layer as that forming the lines of the lower layer and are arranged in the intersecting areas of the wiring channel regions where none of the lines of the lower layer is placed. A method of manufacturing such a semiconductor integrated circuit comprises steps of preparing dummy pedestal layout data for arranging the dummy pedestals in all the intersecting areas of the wiring channel regions and line layout data for forming the lines of the lower layer on predetermined wiring channels among all the wiring channel regions, and combining the dummy pedestal layout data and the line layout data by logical sum (OR).

21 Claims, 27 Drawing Sheets

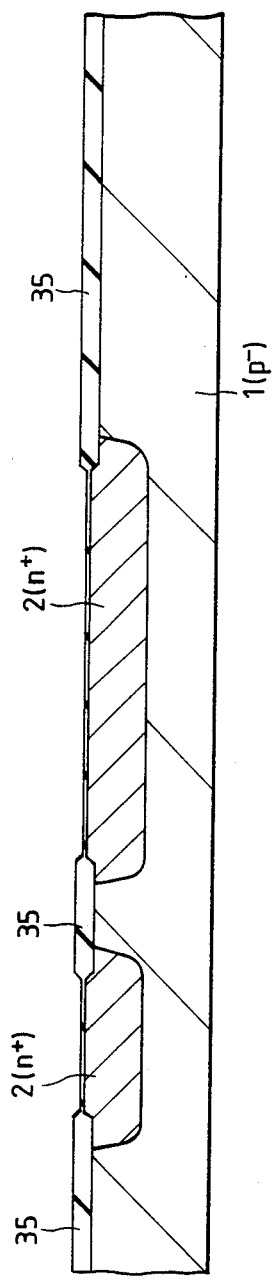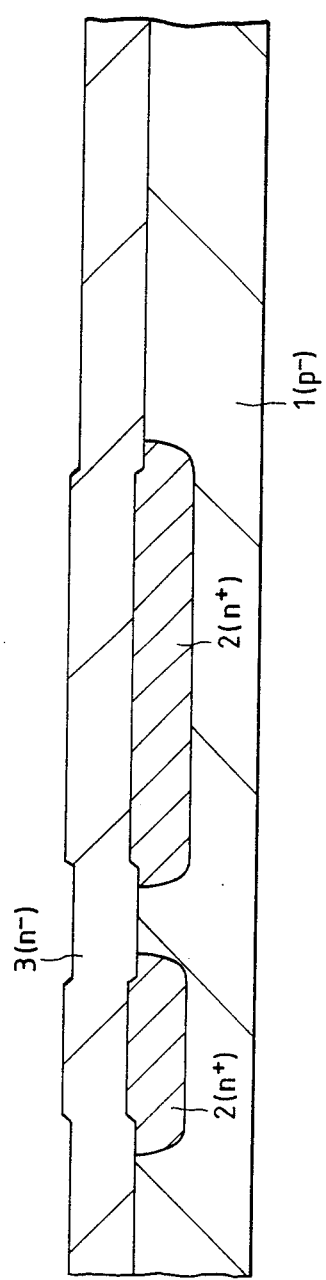

SEMICONDUCTOR INTEGRATED CIRCUIT WITH DUMMY PEDESTALS

BACKGROUND OF THE INVENTION

1. Field of the Invention

The present invention relates to a semiconductor integrated circuit and, more particularly, to a semiconductor integrated circuit provided with an inter-layer insulating film formed between a lower wiring layer and an upper wiring layer.

2. Description of the Prior Art

As is well known, there is a great tendency increase the degree of integration of semiconductor integrated circuits including bipolar transistors as the principal elements, such as memory large-scale integrated (LSI) circuits or logic LSI circuits. To this end, a bipolar transistor developed by the inventors of the present invention has a side wall base contact structure (SICOS) as stated, for example, in Japanese patent Application No. 59-225738. In this bipolar transistor, a base region is formed in a convex land region formed in an active region, and a base electrode is connected to the base region on the side wall of the convex land region. That is, the bipolar transistor having the SICOS diminishes the area of the base region by a decrement corresponding to an area for connecting the base region and the base electrode to increase the degree of integration.

The semiconductor integrated circuit being developed by the inventors of the present invention has a multilayer interconnection (multilayer aluminum interconnection) structure. In such a multilayer interconnection structure, the shape of steps in the lower wiring layer grows with the formation of the upper wiring layers to reduce the step coverage of the upper wiring layer. Reduction in step coverage diminishes the sectional area of wiring lines in the upper wiring layer, and thereby the resistance of the wiring lines is increased and breakage of the wiring lines is caused.

Lines are arranged automatically in the wiring region of the logic LSI circuit by a computer-aided automatic wiring layout (DA) method. The automatic wiring layout method extends lines in specified regions among grid wiring channel regions, namely, a plurality of rows of first wiring channel regions extending along the direction of lines and a plurality of lines of second wiring channel regions extending along the direction of rows. The lines of each layer extend respectively only in the wiring channel regions and, in some cases, it is possible that the lines of a plurality of layers are superposed in the wiring channel regions at the same position. Consequently, the shapes of the steps in the logic LSI circuit of the multilayer interconnection structure are enlarged.

When the automatic wiring layout method is employed, a dummy pedestal method effectively suppresses the enlargement of the shapes of steps in the lower wiring layer. The dummy pedestal method forms a plurality of lower wirings having a basic, rectangular short pattern previously in the first wiring channel region of a wiring region. The plurality of lower wirings are arranged at predetermined intervals along the direction of lines (a direction along which the lines are extended). The lower wiring is shifted by half a pitch relative to the lower wiring of an another adjacent first wiring channel region. Since the lines of the lower wiring layer are used for wiring or dummy pedestals, the lower wiring has a predetermined large size along the direction of lines. That is, the lines (basic short pattern) of the lower wiring layer are formed uniformly in the wiring forming region, and hence irregularity in the height of steps in the surface of a layer insulating film is reduced. The lines in the lower wiring layer are connected by the lines of the upper wiring layer through connecting holes formed in the inter-layer insulating film at positions corresponding to the junctions of the lines of the lower wiring layer. The lines of the upper wiring layer extend in the second wiring channel along the direction of lines. That is, in such a wiring system formed by the dummy pedestal method, signals are transferred by the lines of the lower wiring layer connected by the lines of the upper wiring layer, and the rest of the lines of the lower wiring layer not connected by the lines of the upper wiring layer are used as dummy pedestals.

SUMMARY OF THE INVENTION

The inventors of the present invention found the following problems in employing the above-described dummy pedestal method for obscuring steps in the upper wiring layer caused by steps in the lower wiring layer.

The lower wiring previously formed in the basic short pattern in the wiring region has a large size of a certain length. It often occurs that the respective middle portions of the lower wiring layer and the upper wiring layer are connected and thereby the size of the dummy pedestals becomes large as compared with the substantial length of the lines of the lower wiring layer. That is, the dummy pedestals are often formed integrally with (in electrical connection with) the lines of the lower wiring layer which are to be used for actual wiring. In such a case, the parasitic capacitance of the dummy pedestals is added to that of the lower wiring layer. and Therefore, the signal transfer speed of the lower wiring layer or that of the upper wiring layer connected to the lower wiring layer is reduced and, consequently, the operating speed of the semiconductor integrated circuit is reduced.

The dummy pedestals and the lines of the lower wiring layer are formed in the same conductive layer. Therefore, when the dummy pedestals are large, the lines of the lower wiring layer are often short-circuited by foreign material, which deteriorates the electrical reliability of the semiconductor integrated circuit.

Since the dummy pedestals are large in the above-discussed arrangement, the dummy pedestals often coincide with the plurality of lines of the adjacent upper wiring layer, and the parasitic capacitance between the dummy pedestals and the adjacent upper wiring layer is added to the upper wiring layer in addition to the parasitic capacitance of the dummy pedestals increasing the parasitic capacitance of the upper wiring layer. This reduces the signal transfer speed of the upper wiring layer, and, thereby, the operating speed of the semiconductor integrated circuit is reduced.

Accordingly, it is an object of the present invention to provide a technique for improving the electrical reliability of a semiconductor integrated circuit having a lower wiring layer and an upper wiring layer separated by an inter-layer insulating film formed therebetween by improving the step coverage, and for increasing the operating speed of the semiconductor integrated circuit by reducing an additional parasitic capacitance added to the lower wiring layer.

It is another object of the present invention to provide a technique capable of providing a semiconductor integrated circuit comprising an upper wiring layer and a lower wiring layer separated by an inter-layer insulating film formed therebetween, having a high electrical reliability and capable of operating at a high operating speed, by reducing a parasitic capacitance added to the lower wiring layer of the semiconductor integrated circuit.

It is a further object of the present invention to provide a technique capable of providing a semiconductor integrated circuit comprising an upper wiring layer and a lower wiring layer separated by an inter-layer insulating film, having a high electrical reliability and capable of operating at a high operating speed, by reducing a parasitic capacitance added to the upper wiring layer.

It is still a further object of the present invention to provide a technique capable of providing a semiconductor integrated circuit comprising an upper wiring layer and a lower wiring layer separated by an inter-layer insulating film formed therebetween, having a high electrical reliability and capable of operating at a high operating speed, by reducing the possibility of an accidental short circuit between the lines of the lower wiring layer.

It is a further object of the present invention to provide a method of manufacturing a semiconductor integrated circuit comprising an upper wiring layer and a lower wiring layer separated by an inter-layer insulating film, having a high electrical reliability and capable of operating at a high operating speed.

The above and other objects, features and advantages of the present invention will be apparent from the following description taken in conjunction with the accompanying drawings.

Briefly described, the present invention has the following representative characteristics.

(1) In a semiconductor integrated circuit having a lower wiring layer and an upper wiring layer formed over the lower wiring layer, at least the lines of the lower wiring layer are formed in grid wiring channel regions, and dummy pedestals are formed at the intersections of the wiring channel regions by the same conductive layer as that forming the lines of the lower wiring layer.

(2) A method is provided of manufacturing a semiconductor integrated circuit having a lower wiring layer and an upper wiring layer formed over the lower wiring layer, in which at least the lines of the lower wiring layer are formed in grid wiring channel regions, comprising a step of preparing information for arranging dummy pedestals formed of the same conductive layer as that forming the lines of the lower wiring layer in all the regions of the intersections of the wiring channel regions and information for forming the lines of the lower wiring layer in predetermined wiring channel regions among the wiring channel regions, and a step of composing the information for arranging the dummy pedestals and the information for forming the lines of the lower wiring layer through a logical sum operation.

The means stated in (1) is capable of smoothing the surface of the layer insulating film by forming the dummy pedestals in regions where no line of the lower layer is formed, and the lines of the lower wiring layer are separated from the dummy pedestals to reduce the influence of the parasitic capacitance of the dummy pedestals on the lines of the lower wiring layer. Accordingly, the electrical reliability of the upper wiring layer is improved through the improvement of the step coverage of the upper wiring layer, and the signal transfer speed of the lower wiring layer is increased to enhance the operating speed of the semiconductor integrated circuit.

Since the dummy pedestals can be formed to be very small in size, they can be arranged in the intersections of the wiring channel regions. This improves the reliability of the lines of the lower wiring layer by reducing the likelihood of short-circuiting through the dummy pedestals by foreign material. This correspondingly improves the electrical reliability of the semiconductor integrated circuit.

Furthermore, since the dummy pedestals can be formed so small in size that they can be formed in the intersections of the wiring channel regions, the dummy pedestals will not intersect a plurality of lines of the upper wiring layer. Therefore, the parasitic capacitance added to that of the upper wiring layer is reduced. Consequently, the signal transfer speed of the upper wiring layer is enhanced to increase the operating speed of the semiconductor integrated circuit.

The means stated in (2) forms the lines of the lower wiring layer in the predetermined wiring channel regions and forms the dummy pedestals in the intersections of the wiring channel regions in which no line of the lower wiring layer is formed.

BRIEF DESCRIPTION OF THE DRAWINGS

FIGS. 17 through 32 are sectional views of an essential portion of the bipolar transistor of FIG. 11 in different manufacturing processes;

DESCRIPTION OF THE PREFERRED EMBODIMENTS

Figure 1:
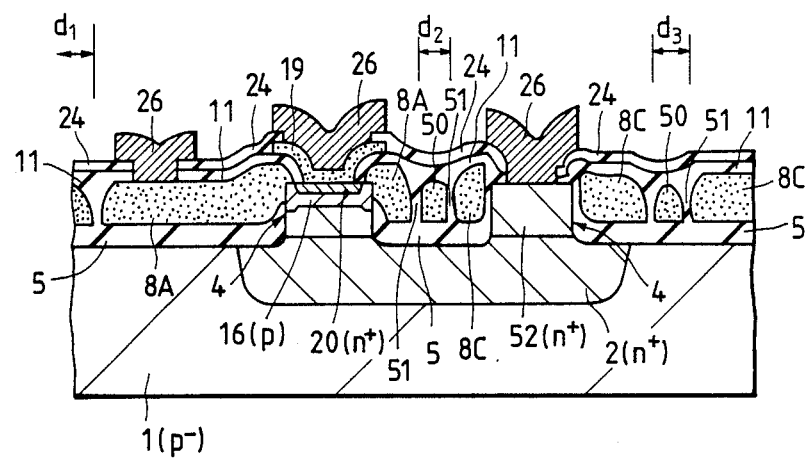
FIG. 1 is a sectional view of an essential portion of a bipolar transistor of the SICOS incorporated into a semiconductor integrated circuit, in a first embodiment, according to the present invention.

The present invention will be described hereinafter with reference to semiconductor integrated circuits each incorporating a bipolar transistor as the principal component, shown in the accompanying drawings, in which parts having the same functions are denoted by the same reference characters and the repetitive description thereof will be omitted.

First Embodiment

The basic conception of the present invention will be described in terms of a semiconductor integrated circuit, in a first embodiment, according to the present invention.

Shown in FIG. 1 are a $p^-$-type semiconductor substrate 1 formed of single crystal silicon, an $n^+$-type semiconductor region 2 for a buried collector region, an element insulating film 5, such as a silicon dioxide film, a p-type semiconductor region 16 for a base region, an $n^+$-type semiconductor region 20 for an emitter region, base electrodes 8A formed of a polycrystalline silicon film, smoothing dummy pedestals 8C formed by patterning the same polycrystalline silicon film forming the base electrodes 8A, smoothing dummy pedestals 50 formed by patterning another polycrystalline silicon film, an insulating film 51, such as a silicon oxide film, filling spaces between the base electrodes 8A, the dummy pedestals 8C and the dummy pedestals 50, an $n^+$-type semiconductor region 52 for picking up collector potential, a layer insulating film 11 such as a silicon dioxide film, an emitter electrode 19 formed of a polycrystalline silicon film, a collector line (a base line or an emitter line) 26, and a layer insulating film 24, such as a silicon dioxide film. In FIG. 1, indicated at $d_1$, $d_2$ and $d_3$ are distances (sizes of gaps) pertaining to the base electrode 8A and the dummy pedestals 8C, which distances will be described in detail hereinafter.

In the conventional semiconductor integrated circuit, the base electrodes 8A are formed through the photolithographic dry etching and selective oxidation of a polycrystalline silicon film, and hence sharp steps are formed when semiconductor elements are stacked up. In the semiconductor integrated circuit in the first embodiment of the present invention, the dummy pedestals 8C formed simultaneously with the base electrodes 8A by patterning the same film, and the dummy pedestals 50 formed by another process fill the grooves between the land regions (convex portions) 4, and thereby the surface of the semiconductor element is smoothed to increase in resistance and breakage of lines 26, such as aluminum lines, which are formed over the surface of the semiconductor element in the subsequent process. The base electrodes 8A, and the dummy pedestals 8C and 50 are perfectly separated and insulated from each other by the insulating film 51.

A basic method of manufacturing the bipolar transistor of the SICOS will briefly be described hereinafter with reference to FIGS. 2 through 6.

First, the major surface of the $p^-$-type semiconductor substrate 1 formed of single crystal silicon is doped with an n-type impurity to form the $n^+$-type semiconductor region 2.

Then, a single crystal $n^-$-type epitaxial layer 3 is formed over the major surface of the semiconductor substrate 1 through an epitaxial growth process.

Figure 2:
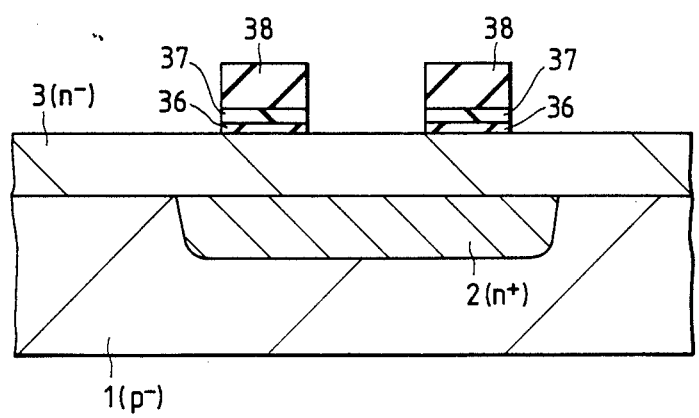
FIGS. 2 through 6 are sectional views of the bipolar transistor of FIG. 1 in different manufacturing processes.

Then, a silicon dioxide film 36 is formed by a hot oxidation process on the major surface of the epitaxial layer 3, a silicon nitride film 37 is deposited by a chemical vapor deposition (CVD) process on the silicon dioxide film 36, and then a silicon dioxide film 38 is deposited by a CVD process on the silicon nitride film 37. As shown in FIG. 2, the layered arrangement of the silicon dioxide film 36, the silicon nitride film 37 and the silicon dioxide film 38 are patterned by a photolithographic dry etching process.

Figure 3:
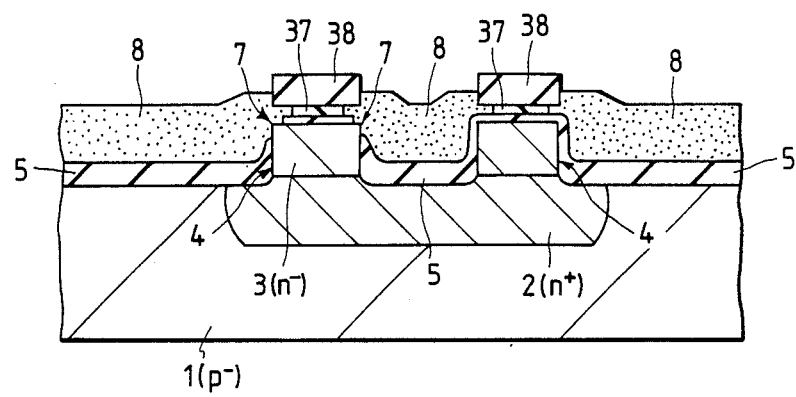

Then, the land regions 4, the element insulating film 5 and connecting holes 7 for connection to a graft base region are formed sequentially by a known method of manufacturing a bipolar transistor of the SICOS. Then, as shown in FIG. 3, the polycrystalline silicon film 8 is formed over the entire surface of the substrate to form a smooth surface. The smooth surface can be formed, for example, by forming a photoresist film over the polycrystalline silicon film 8 and back-etching the surface of the polycrystalline silicon film 8.

Figure 4:
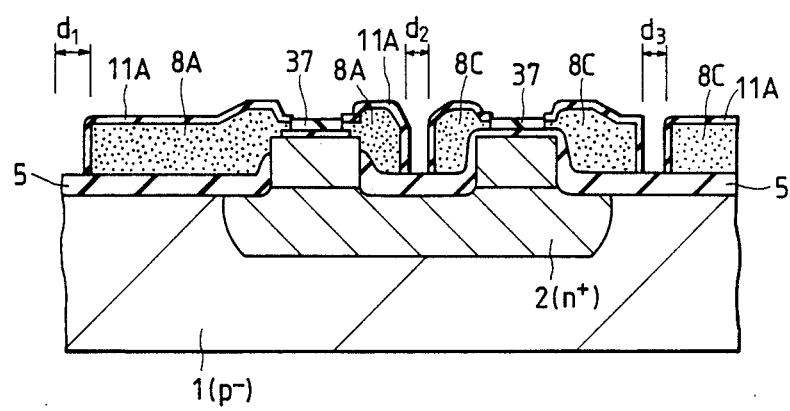

Then, the silicon dioxide film 38 shown in FIG. 3 is removed by etching, and then the polycrystalline silicon film 8 is patterned to form the base electrodes 8A and the dummy pedestals 8C. The interval $d_1$ between the base electrodes 8A, the interval $d_2$ between the base electrode 8A and the dummy pedestal 8C and the interval $d_3$ between the dummy pedestals 8C (FIG. 4) are not more than a predetermined interval, for example, 2 $\mu$m or less. The base electrodes 8A and the dummy pedestals 8C are formed by etching the polycrystalline silicon film through a photolithographic dry etching process using a mask so that the adjacent base electrodes 8A and the dummy pedestal 8C are separated from each other by the predetermined interval. As shown in FIG. 4, the respective surfaces of the base electrodes 8A and the dummy pedestals 8C are coated with insulating films 11A. The insulating films 11A are silicon dioxide films formed by heat oxidation and having a thickness in the range of 300 to 2000Å.

Figure 5:
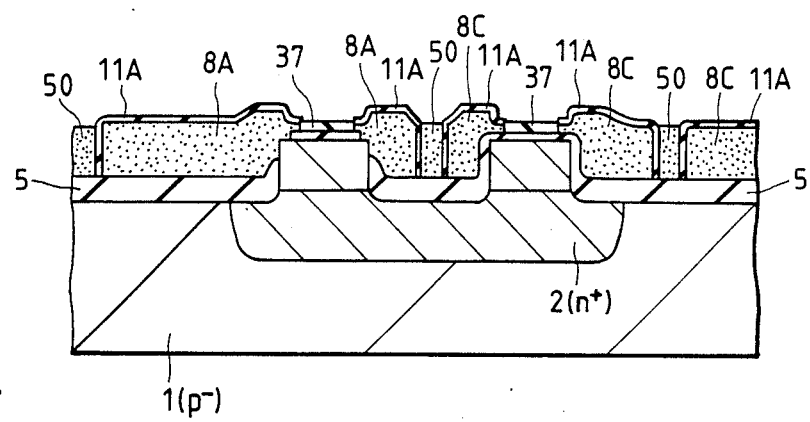

Referring to FIG. 5, polycrystalline silicon film is formed over the semifinished bipolar transistor shown in FIG. 4 and the polycrystalline silicon film is etched to form dummy pedestals 50 in grooves between the base electrodes 8A, between the dummy pedestals 8C and between the base electrodes 8A and the dummy pedestal 8C. The height of the dummy pedestals 50 is approximately half the width ($d_1$, $d_2$ and $d_3$) of the grooves or greater.

Figure 6:
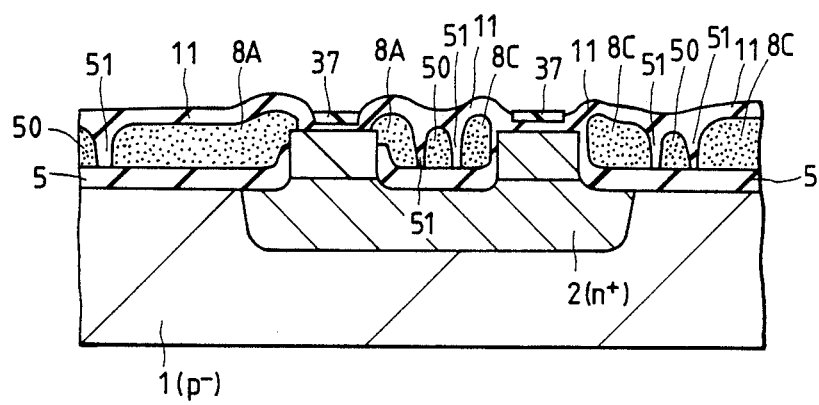

Then, the bipolar transistor of FIG. 5 is subjected to heat oxidation using the silicon nitride film 37 as an antioxidation mask to form layer insulating films 11 over the base electrodes 8A, the dummy pedestals 8C and the dummy pedestals 50, and insulating films 51 between the base electrodes 8A, the dummy pedestals 8C and the dummy pedestals 50 as shown in FIG. 6. The thickness of the layer insulating films 11 is in the range of 2000 to 5000Å.

Thus, the sharp stepped arrangement of the surfaces of the base electrodes 8A, the dummy pedestals 8C and the dummy pedestals 50 is smoothed by the layer insulating films 11 and the insulating films 51. In this embodiment, although the base electrodes 8A and the dummy pedestals 8C are formed in the same conductive layer and the dummy pedestals 50 are formed in another conductive layer, such an arrangement of the base electrodes 8A, the dummy pedestals 8C and the dummy pedestals 50 do not adversely affect the electrical characteristics of the semiconductor integrated circuit, because the base electrodes 8A, the dummy pedestals 8C and the dummy pedestals 50 are insulated perfectly from each other by the insulating film 51.

Figure 7:
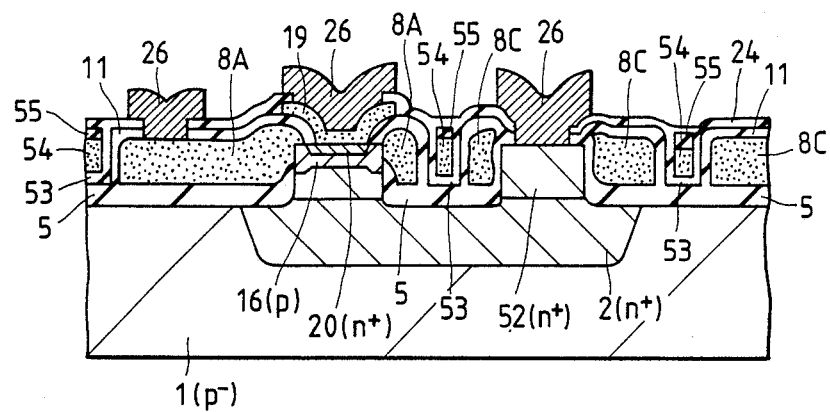
FIGS. 7 through 10 are sectional views showing the respective essential portions of bipolar transistors of SICOS incorporated in modifications of the semiconductor integrated circuit of FIG. 1.

Then, the silicon nitride films 37 (FIG. 6) are removed, and then the n+-type semiconductor region 52 for picking up collector potential and the p-type semiconductor region 16 for use as an intrinsic base region are formed by an ion implanting process. Then, as shown in FIG. 7, the emitter electrode 19 (polycrystalline silicon film) is formed, and then an n-type impurity is implanted through the emitter electrode 19 in the major surface of the p-type semiconductor region 16 to form the n+-type semiconductor region 20 for use as an emitter region.

Then, silicon nitride or phosphoric silicate glass (PSG) is deposited in a film to form the layer insulating film 24, and then connecting holes are formed in the layer insulating film 24. Then, a wiring 26 is formed on the layer insulating film 24 to interconnect the regions in a predetermined wiring pattern as shown in FIG. 1.

Thus, the bipolar transistor of the SICOS is formed through a series of foregoing manufacturing processes.

FIGS. 7 through 10 illustrate bipolar transistors of the SICOS which may be incorporated into the semiconductor integrated circuit in the first embodiment.

The bipolar transistor of the SICOS shown in FIG. 7 has silicon nitride films 53, polycrystalline silicon dummy pedestals 54 and silicon dioxide films 55. In the foregoing bipolar transistor, only the polycrystalline silicon film is formed in the grooves between the base electrodes 8A to form the dummy pedestals 8C and 54 in the grooves. In this bipolar transistor, the respective thin surface layers of the base electrodes 8A and the dummy pedestals 8C are oxidized, silicon nitride films 53 are formed over the surfaces of the base electrodes 8A and the dummy pedestals 8C, and then dummy pedestals 54 are formed in grooves between the base electrodes 8A and the dummy pedestals 8C. Accordingly, strain of the dummy pedestals 54 produced in forming the silicon dioxide films over the dummy pedestals 54 is absorbed by the silicon nitride films 53, and thereby the possibility of development of faults in the crystal structure of the single crystal silicon substrate 1 is reduced. Consequently, semiconductor integrated circuits are manufactured at a high yield rate. The possibility of development of faults in the crystal structure of the single crystal silicon substrate 1 can be reduced also by omitting the silicon dioxide film 55 formed over the surfaces of the dummy pedestals 54.

Figure 8:
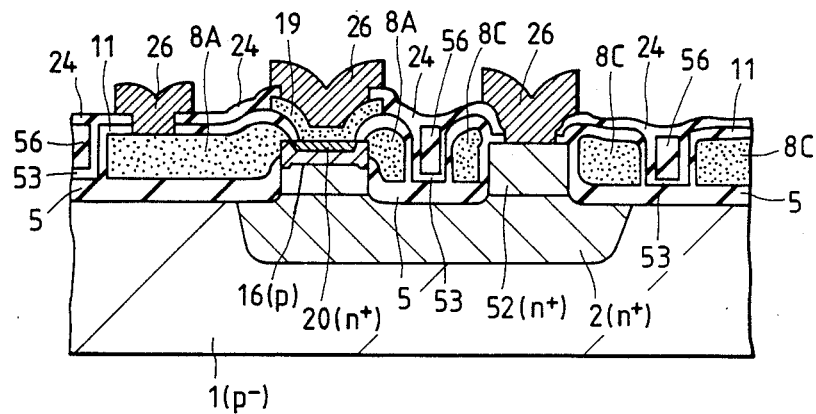

The bipolar transistor of the SICOS shown in FIG. 8, similarly to that shown in FIG. 7, has silicon nitride films 53 formed in the grooves and dummy pedestals 56 formed in the grooves coated with the silicon nitride films 53. The dummy pedestals 56 are formed of an insulating material such as silicon dioxide, PSG, silicon oxynitride (SiON) or silicon dioxide containing silicon. Since the parasitic capacitance of the dummy pedestals 56 is small, the employment of such dummy pedestals 56 provides a high-performance semiconductor integrated circuit.

The bipolar transistors shown in FIGS. 1, 7 and 8 have, in addition to the dummy pedestals 8C, the dummy pedestals (polycrystalline silicon films) 54 and 56, respectively, formed by a process other than that for forming the dummy pedestals 8C, to smooth the surface of the semiconductor element. In a bipolar transistor of the SICOS shown in FIG. 9, base electrodes 8A and dummy pedestals 50, or dummy pedestals 8C and 50 are formed integrally to smooth the surface of the semiconductor element. Grooves filled by the dummy pedestals 8C and 50 for smoothing are not defined only by the pattern of the conductive film forming the base electrodes 8A, but are defined by the patterns of the conductive films as indicated by an interval $d_1$ in FIG. 9 or by the pattern of the conductive film and the pattern of a land region 4 as indicated by intervals $d_2'$ and $d_3'$ in FIG. 9. In this case, values of the intervals $d_2'$ and $d_3'$ must be decided so that the intervals $d_2'$ and $d_3'$ are the same as or smaller than the interval $d_1$ taking an error in registering a mask for forming the pattern of the conductive film and an error in registering a mask for forming the pattern of the land region 4 into account.

Figure 9:
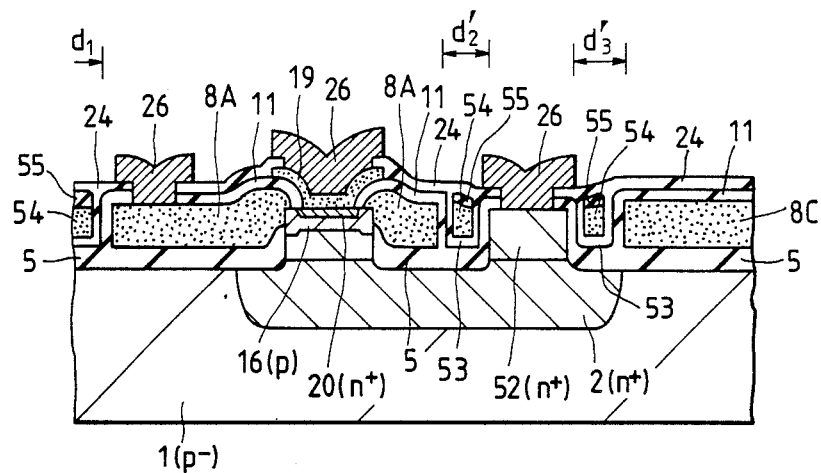
Figure 10:
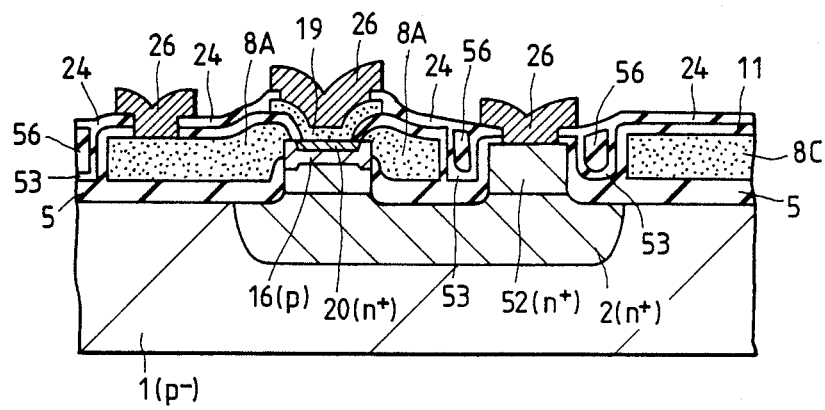

A bipolar transistor of the SICOS shown in FIG. 10 has insulating dummy pedestals 56 the same as that shown in FIG. 8 formed for smoothing in grooves instead of the polycrystalline silicon dummy pedestals 54 and the silicon dioxide film 55 of the bipolar transistor of FIG. 9.

The silicon nitride films 53 (FIGS. 8 and 10) may be omitted provided that the omission of the silicon nitride films 53 does not affect adversely to the electrical characteristics and the smoothness of the surface of the bipolar transistors.

Although the base electrodes 8A of the foregoing exemplary bipolar transistors are formed of a polycrystalline silicon film, and the silicon dioxide films 11 are formed over the surfaces of the base electrodes 8A, the base electrodes 8A may be formed of a film of metal silicide having a high melting point, such as a silicide of W, Mo, Pt, Pd or Ti, and the surfaces of the base electrodes 8A may be coated with oxidized metal silicide or with insulating films, such as silicon dioxide films, formed by a CVD process.

Although the present invention has been described as applied to a semiconductor integrated circuit employing a bipolar transistor of a longitudinal structure in which the electrodes are led out from the base region (active region) by conductive films, the present invention is applicable also to a semiconductor integrated circuit employing a bipolar transistor of a lateral structure in which the electrodes are led out from the emitter region and the collector region by conductive films, and to a semiconductor integrated circuit employing an MOS field effect transistor in which the electrodes are led out from the source region and the drain region by conductive films.

As apparent from the foregoing description, in the semiconductor integrated circuit in the first embodiment, the height of steps in the surface of the semiconductor element attributable to the steps of the lines 26 (aluminum lines) formed in the lower wiring layer is as small as approximately 0.3 μm, whereas the corresponding height of the conventional semiconductor integrated circuit is as large as approximately 1.0 μm. Accordingly, increase in the resistance and breakage of the lines 26 are reduced effectively, the electrical reliability of the semiconductor integrated circuit is enhanced, and the yield of the production line for manufacturing the semiconductor integrated circuit is improved. According to the results of evaluation of the characteristics of the semiconductor integrated circuit of the present invention, the yield rate was increased remarkably the semiconductor integrated circuit of the present invention is higher by far than that of the conventional semiconductor integrated circuit.

Second Embodiment

A semiconductor integrated circuit LSI, in a second embodiment, according to the present invention, incorporating bipolar transistors of the SICOS will be described hereinafter.

Figure 12:
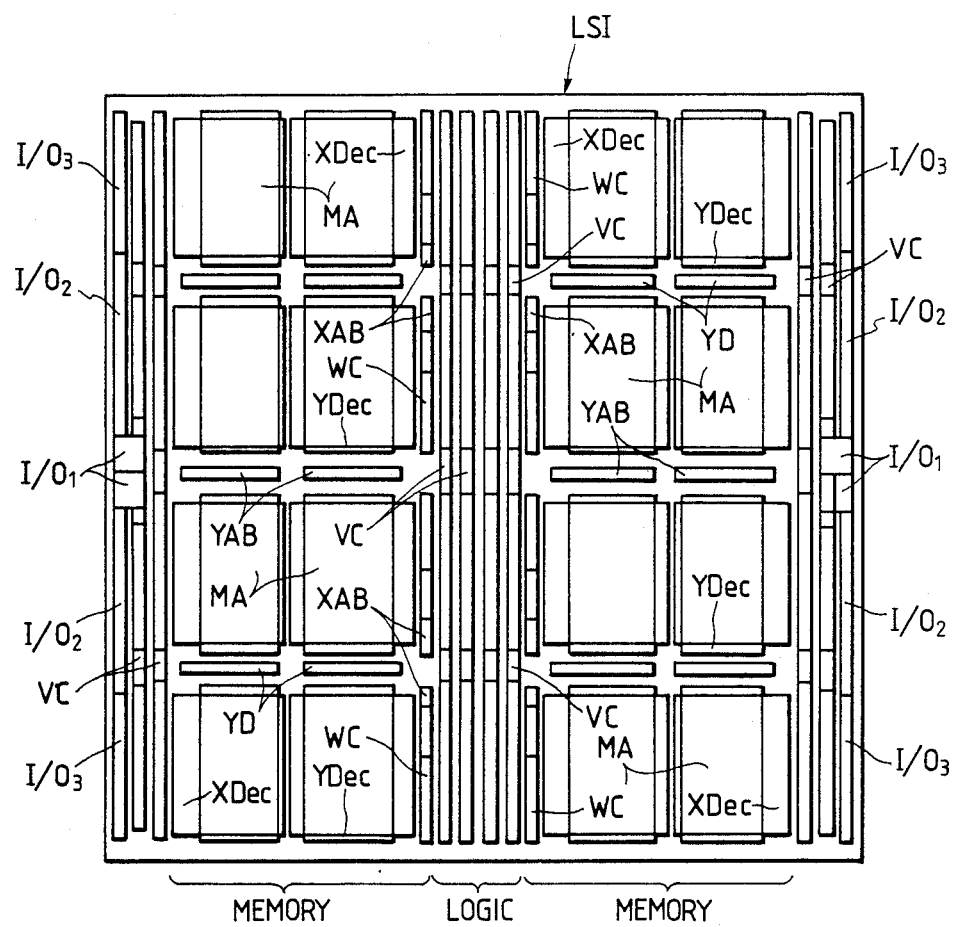
FIG. 12 is an illustration showing the chip layout of the semiconductor integrated circuit of FIG. 11.

Referring to FIG. 12, the semiconductor integrated circuit LSI is formed in a square chip having sides of approximately 10 mm. Input/output circuits I/O$_1$, I/O$_2$ and I/O$_3$ and power circuits VC are disposed in the right and left peripheral portions of the semiconductor integrated circuit LSI. A logical operation circuit L is disposed in the central portion of the semiconductor integrated circuit LSI. Memory units Ms are disposed respectively on the opposite sides of the logical operation circuit L.

The right memory unit M comprises eight memory cell arrays MA, and the left memory unit M comprises eight memory cell arrays. Disposed around each memory cell array MA are an X-decoder circuit X-Dec, an X-address buffer circuit X-AB, a write circuit WC, a Y-decoder circuit Y-Dec, a Y-address buffer circuit Y-AB and a Y-driver circuit YD.

Although not shown, memory cells are arranged in the memory cell array MA at the intersections of digit lines and information holding lines, and word lines. A memory cell being developed by the inventors of the present invention comprises a flip-flop consisting of a Schottky barrier diode (SBD), a forward bipolar transistor, a reverse bipolar transistor, a high resistance and a low resistance. That is, the memory cell is a resistance changeover type memory cell with SBD.

Figure 13:
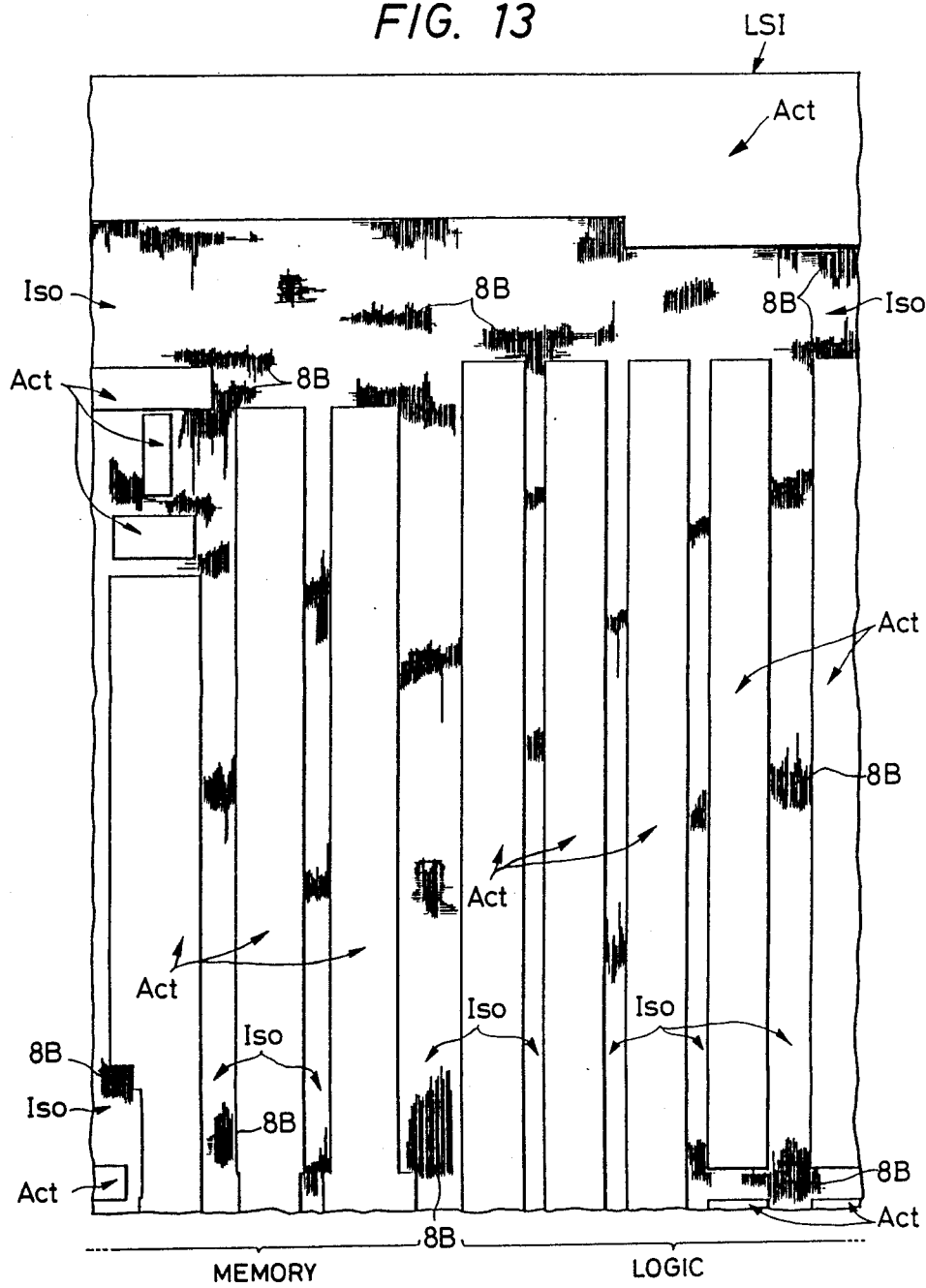
FIG. 13 is an enlarged plan view of an essential portion of the semiconductor integrated circuit of FIG. 12.

As shown in FIG. 13, the logical operation circuit L and the memory unit M have each a plurality of active regions Acts. As shown in FIG. 4, a bipolar transistor Tr and a resistance element R of each circuit is provided in the active region Act. The bipolar transistor Tr consists essentially of a collector region C, a base region B and an emitter region E.

Figure 14:
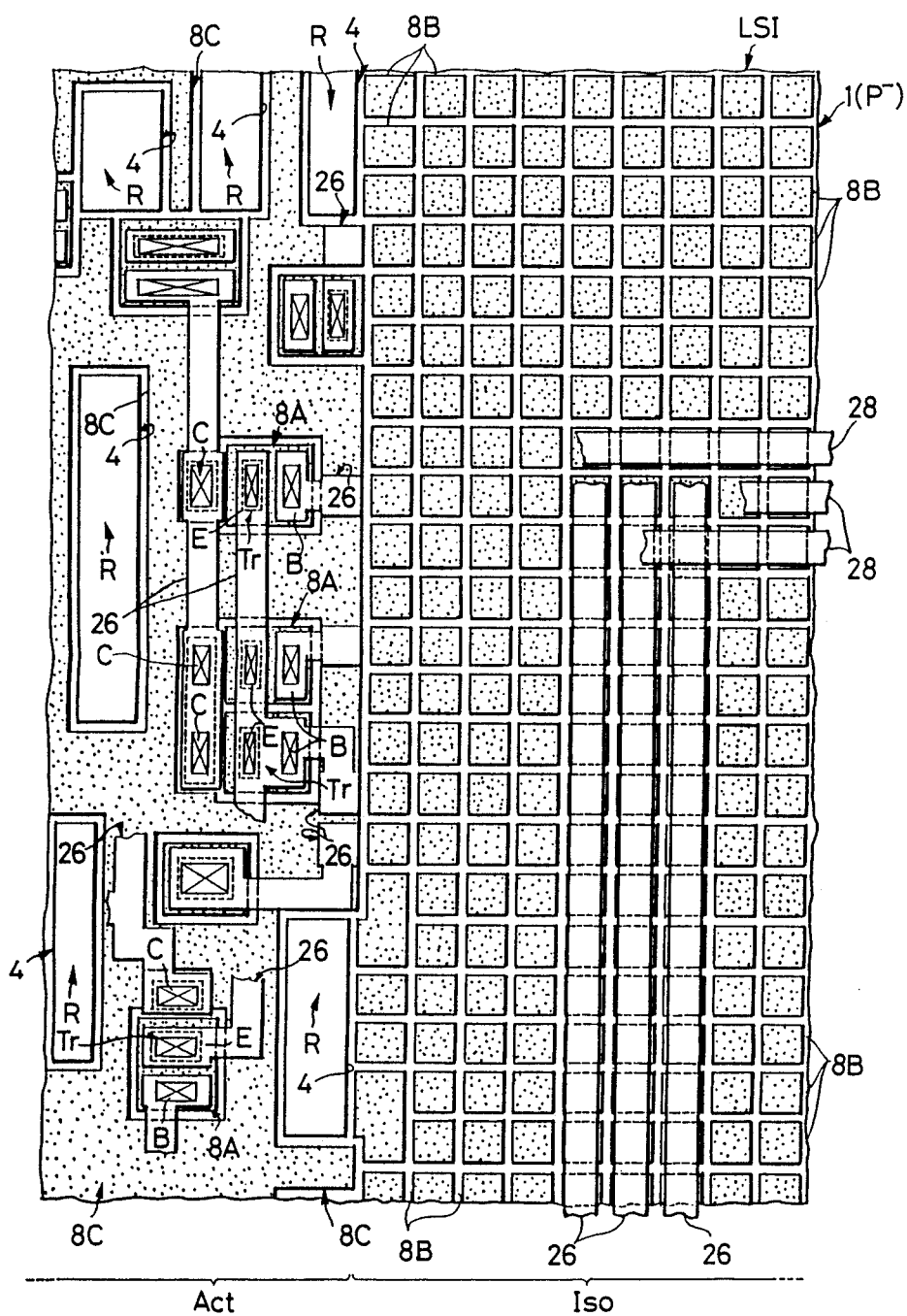
FIG. 14 is an enlarged plan view of an essential portion of the semiconductor integrated circuit of FIG. 13.

As shown in FIG. 13, the adjacent active regions Acts are separated by an isolation region Iso. As shown in FIG. 14, the isolation region Iso is used as a wiring forming region (wiring channel forming region). That is, lines 26 and 28 for interconnecting circuits formed in the individual active region Act and circuits respectively formed in the separate active regions Acts are formed in the isolation regions Iso.

The semiconductor integrated circuit LSI of the present invention, for example, has a multilayer interconnection structure having four wiring layers. As shown in FIG. 14, the bipolar transistors Tr of the active region Act are interconnected by lines 26 formed in the first wiring layer. The circuits formed in one of the active regions Acts and the circuits formed in another active regions Act are interconnected by the lines 26 formed in the first wiring layer and the lines 28 formed in the second wiring layer. The lines 26 extend in the first wiring layer along the isolation region Iso along the direction of rows, while the lines 28 extend in the second wiring layer across the isolation region Iso in along the direction of lines as shown in FIG. 14. Lines 30 formed in the third wiring layer and lines 32 formed in the fourth wiring layer are principally signal lines and power lines, respectively.

A concrete constitution of a memory cell provided in the memory cell array MA formed in the active region Act, more particularly, in the memory unit M will be described with reference to FIG. 11.

The semiconductor integrated circuit LSI has a p$^-$-type semiconductor substrate 1 formed of single crystal silicon. An n$^-$-type epitaxial layer 3 is formed over the major surface of the semiconductor substrate 1. The forward bipolar transistor Tr$_1$, the reverse bipolar transistor Tr$_2$, the Schottky barrier diode SBD, the high resistance R$_H$, and the low resistance R$_L$ are formed in the active region Act on the major surface of the semiconductor substrate 1. These semiconductor elements constitute a flip-flop to form a resistance changeover memory cell with SBD for a static RAM.

The semiconductor elements, particularly, the forward bipolar transistor Tr$_1$, the reverse bipolar transistor Tr$_2$ and the high resistance R$_H$, are electrically insulated from each other by the element isolating region includes mainly the semiconductor substrate 1, an element isolating and insulating film 5 and a p$^+$-type semiconductor region 6. The element isolating and insulating film 5 has a thickness in the range of 3000 to 5000Å and is formed so that defects in the crystal structure of the semiconductor substrate 1 at positions corresponding to the corners of land regions 4 and in the epitaxial layer 3. The thickness of the element isolating and insulating film 5 is smaller than the ordinary element isolating and insulating film. The p$^+$-type semiconductor region 6 is formed over the major surface of the semiconductor substrate 1 under the element isolating and insulating film 5.

The forward bipolar transistor Tr$_1$ is an npn-type transistor comprising an n-type collector region, a p-type base region and an n-type emitter region.

The collector region comprises a buried n$^+$-type semiconductor region 2 and a potential pick up n$^+$-type semiconductor region, not shown. The n$^+$-type semiconductor region 2 is formed between the semiconductor substrate 1 and the epitaxial layer 3 to reduce collector resistance.

The base region comprises a p$^+$-type semiconductor region 9 and a p-type semiconductor region 16. The p-type semiconductor region 16 is formed on the major surface of the epitaxial layer 3 at a land region 4 formed of the epitaxial layer 3 in the active region Act, and is used as an intrinsic base region. The p$^+$-type semiconductor region 9 is formed on the major surface of the epitaxial layer 3 over the side wall of the land region 4, and is used as a graft base region.

The emitter region comprises an n-type semiconductor region 17 and an n$^+$-type semiconductor region 20. The n-type semiconductor region 17 is formed on the major surface of the p-type semiconductor region 16 (base region) formed in the land region 4. The n$^+$-type semiconductor region 20 is formed on the major surface of the n-type semiconductor region 17.

One end of a base electrode 8A is connected through the connecting hole 7 formed in the element isolating and insulating film 5 formed on the side wall of the land region 4. The other end of the base electrode 8A is led out on the element isolating and insulating film 5 in the element isolating region. That is, the forward bipolar transistor Tr$_1$ is constituted in the SICOS. The base electrode 8A is formed of the polycrystalline silicon film doped with a p-type impurity in the first layer. The p$^+$-type semiconductor region 9 in the base region is formed by diffusing the p-type impurity doping the base electrode 8A through the connecting hole 7 in the epitaxial layer 3. That is, the p$^+$-type semiconductor region 9 self aligns with the base electrode 8A. The forward bipolar transistor Tr$_1$ of the SICOS omits substantially an area necessary for connecting the base electrode 8A and the p$^+$-type semiconductor region 9 (base region) in a plane, and thereby the area of the base region is reduced to increase the degree of integration.

As shown in FIG. 14, the base electrode 8A is connected through a connecting hole 25 formed in the layer insulating film 24 to the line 26 formed in the first layer. The lines 26 formed of a composite film comprising an aluminum film 26B formed over a barrier metal film 26A such as a TiN film. Cu for preventing stress migration and/or Si for preventing alloy pits is added to the aluminum film 26B.

An emitter electrode 19 is connected through a connecting hole (an emitter opening) formed in the layer insulating film 13 to the n$^+$-type semiconductor region 20 of the emitter region. The emitter electrode 19 is formed of a polycrystalline silicon film doped with an n-type impurity in the second layer. The layer insulating film 13 is a silicon dioxide film formed by heat-oxidizing the surface of the base electrode 8A. The size of the opening of the connecting hole 18 is defined by the layer insulating film 13 and the connecting hole 18 self aligns with the base electrode 8A. thus, the emitter electrode 19 is in self alignment with the base electrode 8A and is connected to the n$^+$-type semiconductor region 20 (emitter region). The n$^+$-type semiconductor region 20 is formed in a region defined by the connecting hole 18 by doping the major surface of the n-type semiconductor region 17 through the emitter electrode 19 with an n-type impurity. That is, the n$^+$-type semiconductor region 20 in self alignment with the emitter electrode 19.

The emitter electrode 19 is connected, similarly to the base electrode 8A, to the line 26.

The collector potential pickup n$^+$-type semiconductor region, not shown, of the collector region is formed over the major surface of the epitaxial layer 3 in the land region 4. The collector potential pickup n$^+$ semiconductor region is connected, similarly to the base region and the emitter region, through the collector electrode 19 or directly to the line 26.

The reverse bipolar transistor Tr$_2$ is an npn-type transistor comprising an n-type collector region, a p-type base region and an n-type emitter region.

The emitter region comprises a buried n$^+$-type semiconductor region 2 and an emitter potential pickup n$^+$-type semiconductor region, not shown.

The base region comprises a p$^+$-type semiconductor region 9 and a p-type semiconductor region 14. The p-type semiconductor region 14 is provided on the major surface of the epitaxial layer 3 on a land region 4. The p-type semiconductor region 14 is used as an intrinsic base region. The p$^+$-type semiconductor region 9 is formed on the major surface of the epitaxial layer 3 over the side wall of the land region 4 and is used as a graft base region.

The collector region comprises an n-type semiconductor region 15 and an n$^+$-type semiconductor region 20. The n-type semiconductor region 15 is provided on the major surface of the base region (the p-type semiconductor region 14) formed in the land region 4. The n$^+$-type semiconductor region 20 is provided on the major surface of the n-type semiconductor region 15.

The p$^+$-type semiconductor region 9 of the base region is connected, similarly to that of the forward bipolar transistor Tr$_1$, through a base electrode 8A to the line 26. Thus, the reverse bipolar transistor Tr$_2$ has the SICOS. The emitter potential pickup n$^+$-type semiconductor region, not shown, of the emitter region is connected through an emitter electrode 19 to the line 26. The n$^+$-type semiconductor region 20 of the collector region is connected through the collector electrode 19 to the line 26.

The reverse bipolar transistor Tr$_2$ has a collector terminal, which serves as an information storage part (storage node) of the memory cell, formed in the surface of the epitaxial layer 3. Thus, the reverse bipolar transistor Tr$_2$ stops minority carriers produced by α rays that fall on the semiconductor substrate 1 by the p-type semiconductor region 14 (base region) to obviate software errors.

The Schottky barrier diode SBD comprises an n-type semiconductor region 17 (cathode region) formed integrally with the emitter region of the forward bipolar transistor Tr$_1$, and a platinum silicide film (anode region), not shown. The platinum silicide film is formed selectively on the major surface of the n-type semiconductor region 17, namely, between the n-type semiconductor region 17 and the barrier metal film 26A of the line 26. The Schottky barrier diode SBD has a shielded structure. That is, the n-type semiconductor region 17 (cathode region) of the Schottky barrier diode SBD is shielded by the base region including the p-type semiconductor region 16 and the p$^+$-type semiconductor region 9 of the forward bipolar transistor Tr$_1$. The Schottky barrier diode SBD is connected through the low resistance R$_L$ to the collector terminal (information storage part) of the reverse bipolar transistor Tr$_2$. Thus, the Schottky barrier diode SBD is shielded from minority carriers produced by α rays that fall on the semiconductor substrate 1.

The low resistance R$_L$ of the memory cell is formed integrally with the n-type semiconductor region 17 (emitter region) of the forward bipolar transistor Tr$_1$.

The high resistance R$_H$ of the memory cell is formed integrally with a p$^-$-type semiconductor region 10. The p$^-$-type semiconductor region 10 is provided on the major surface of the epitaxial layer 3 in the land region 4.

The memory cell has a capacitance element Ca. The capacitance element Ca is a stacked element formed by sequentially forming a lower electrode 19, a dielectric film 28 and an upper electrode 23 in that order in layers. The lower electrode 19 is formed of polycrystalline silicon film integrally with the emitter electrode 19. The dielectric film 23 is, for example, a tantalum oxide (Ta$_2$O$_5$) film. The upper electrode 28 is a metallic film having a high melting point such as MoSi$_2$. The dielectric film 23 and the upper electrode 28 are the same in pattern.

The lines 28 of the second layer are formed over an layer insulating film 27 covering the lines 26 of the first layer. The lines 30 of the third layer are formed on an layer insulating film 29 covering the lines 28 of the second layer. The lines 32 of the fourth layer are formed on a layer insulating film 31 covering the lines 30 of the third layer. The lines 28 of the second layer, the lines 30 of the third layer, and the lines 32 of the fourth layer are formed of an aluminum film or an aluminum film containing Cu and/or Si. The lines 32 of the fourth layer are covered with a passivation film 33.

As shown in FIG. 14, dummy pedestals 8C are formed between the land regions 4, namely, on the element isolating and insulating film 5 forming the element isolating region in the active region Act. The dummy pedestals 8C, the base electrode 8A of the forward bipolar transistor $Tr_1$ and the base electrode 8A of the reverse bipolar transistor $Tr_2$ are formed by the same conductive layer. As mentioned in the description of the first embodiment, the dummy pedestals 8C are separated from the base electrodes 8A by a predetermined distance are electrically isolated from the base electrodes 8A. When the minimum processing size is, for example, 1 $\mu$m, intervals between the dummy pedestals 8C and the base electrodes 8A are on the order of 1 $\mu$m. In regions where no base electrode 8A is formed, the dummy pedestals 8C are separated from the land regions 4 by the same interval.

The dummy pedestals 8C are so formed as to reduce the height of steps attributable mainly to the protrusion of the land regions 4, the base electrodes 8A, the emitter electrodes 19 and the collector electrodes 19. Steps attributable to the protrusion of the base electrodes 8A and the land regions 4 are greater than those attributable to the protrusion of the emitter electrodes 19 and the collector electrodes 19. That is, the dummy pedestals 8c are formed mainly to smooth the surface of the layer insulating film 24 serving as a ground for the lines 26 of the first layer.

Since the respective lengths of the lines 26 of the first layer extending in the active region Act are as small as lengths only sufficient to interconnect the adjacent semiconductor elements, the parasitic capacitance of the lines 26 is substantially negligible. Since the surface of the active region Act has many steps from the plurality of land regions 4 and the plurality of base electrodes 8A, the dummy pedestals 8C are formed substantially over the entire area of the active region Act.

Thus, the semiconductor elements $Tr_1$, $Tr_2$ and SBD are connected to the electrodes 8A and 19, layer insulating films 11, 21 and 24 are formed over the electrodes, and the lines 26 are formed over the layer insulating films 11, 21 and 4 in the active region Act of the semiconductor integrated circuit LSI, in which the dummy pedestals 8C are formed so as to fill up substantially all the recesses, namely, the entire element isolating regions, between the semiconductor substrate 1 and the layer insulating films 11, 21 and 24 in the active region Act. Accordingly, the height of the steps formed in the layer insulating film 24 attributable to the semiconductor elements and the electrodes is reduced to smooth the surface of the layer insulating film 24, and thereby the coverage of the lines 26 is improved and the electrical reliability of the lines 26 is enhanced. Since the bipolar transistor of the SICOS, in particular, has lands 4 protruding in the active region Act, large steps are formed inevitably in the surface of the layer insulating film 24, and hence the present invention is particularly effectively applicable to the bipolar transistor of the SICOS.

Figure 11:
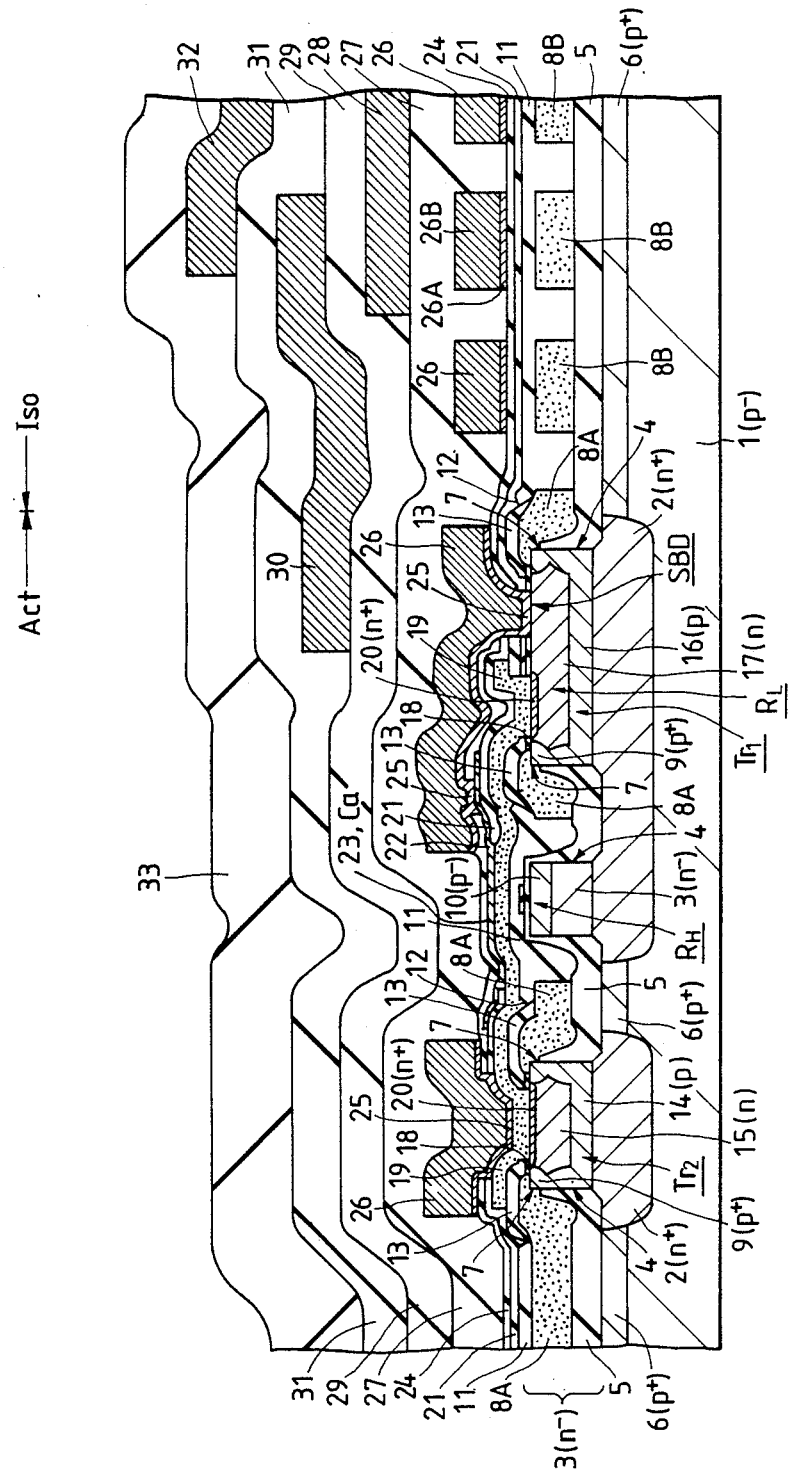
FIG. 11 is a sectional view of an essential portion of a bipolar transistor of the SICOS incorporated into a semiconductor integrated circuit, in a second embodiment, according to the present invention.

As shown in FIGS. 11, 13 and 14, dummy pedestals 8B are arranged on the element isolating and insulating film 5 in the isolating region Iso. The dummy pedestals 8B, similarly to the dummy pedestals 8C, are formed in the conductive layer integrally with the base electrodes 8A of the forward bipolar transistor $Tr_1$ and the reverse bipolar transistor $Tr_2$, and the dummy pedestals 8B are formed in a pattern substantially coinciding (synchronized) with that of the lines 26 formed in the first layer over the dummy pedestals 8B. That is, the width of the dummy pedestals 8B is substantially the same as that of the lines 26 of the first layer, and the intervals between the dummy pedestals 8B are substantially the same as the corresponding intervals of the lines 26 of the first layer. For example, when the minimum processing size is 1 $\mu$m, the size of the dummy pedestals 8B along the width of the lines 26 is on the order of 4 $\mu$m and the intervals between the dummy pedestals 8B are on the order of 1 $\mu$m. The size of the dummy pedestals 8B and the intervals between the same along the direction of extension of the lines 26 are the same as the size and intervals of the lines 26, respectively. That is, the dummy pedestals 8B are formed in a square shape and are arranged regularly in lines and rows, namely, in the shape of a grid, at intervals on the order of 5 $\mu$m. The shape of the dummy pedestals 8B need not necessarily be square, the same may be rectangular, circular, elliptical or polygonal.

Figure 15:
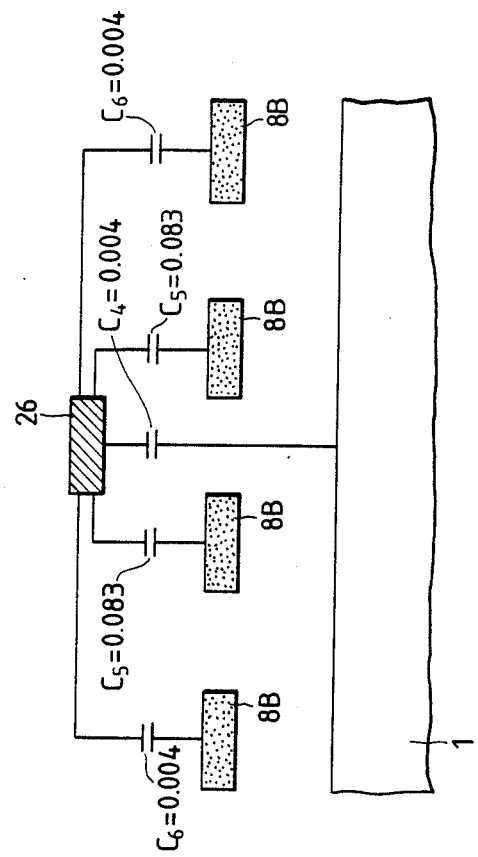
FIGS. 15 and 16 are diagrammatic illustrations typically showing the lines of the semiconductor integrated circuit of FIG. 11.
Figure 16:
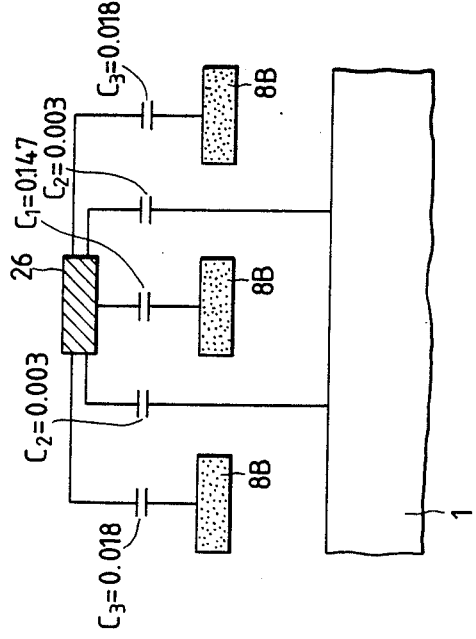

The center lines of the dummy pedestals 8B coincide substantially with the center lines of the lines 26 of the first layer formed over the dummy pedestals 8B. FIGS. 15 and 16 are models used for the simulation of parasitic capacitance conducted by the inventors of the present invention. Although not shown in FIG. 15 and 16, the lines 26 are shielded from the parasitic capacitance by the dummy pedestals 8B electromagnetically spread over the entire area of the isolating region Iso, when the dummy pedestals 8B are spread over the entire area of the isolating region Iso similarly to the dummy pedestals 8C arranged in the active region Act, namely, the parasitic capacitance between the dummy pedestals 8B and the semiconductor substrate 1 becomes infinity. Accordingly, the parasitic capacitance between the lines 26 and the dummy pedestals 8B is dominant among the parasitic capacitance acting on the lines 26 and is considerably large. Since the lines 26 interconnecting the circuits formed in the active region Act and the circuits formed in other active region Act are extended in the isolating region Iso, The total length of the lines 26 is considerably large and a large parasitic capacitance is added to the lines 26, which reduces signal transfer speed notably. In view of the results of the simulation, according to the present invention, at least the dummy pedestals 8B formed in the isolating region Iso are arranged in the shape of a grid to produce a small parasitic capacitance positively between the lines 26 and the semiconductor substrate 1.

FIG. 15 shows a parasitic capacitance added to the lines 26 when the respective patterns of the lines 26 of the first layer and the dummy pedestals coincide with each other and the center lines of the dummy pedestals 8B coincide with the corresponding center lines of the lines 26. In FIG. 15, indicated at $C_1$ is a parasitic capacitance $C_1$ between the dummy pedestal 8B and the line 26 directly below the same dummy pedestal 8B, indicated at $C_2$ is a parasitic capacitance between the lines 26 and the semiconductor substrate 1 (actually, the p+-type semiconductor region 6), and indicated at $C_3$ is a parasitic capacitance between the line 26 and the dummy pedestals 8B in the vicinity of the dummy pedestal 8B directly below the same line 26. The respective values of the parasitic capacitances $C_1$, $C_2$ and $C_3$ are indicated in FIGS. 15 and 16 in pF/mm. As shown in FIG. 15, the parasitic capacitance $C_1$ is considerably large, while the parasitic capacitance $C_2$ is very small because the semiconductor substrate 1 can be seen from the lines 26 through gaps between the dummy pedestals 8B. Since the line 26 and the dummy pedestal 8B in the vicinity of the dummy pedestal 8B directly below the same line 26 is separated by a distance corresponding to the intervals between the dummy pedestals 8B corresponding to a maximum size, the parasitic capacitance $C_3$ is very small. Accordingly, the parasitic capacitance $C_2$ between the lines 26 and the semiconductor substrate 1 is dominant among those added to the lines 26, and hence the least parasitic capacitance is added to the lines 26. According to the results of simulation conducted by the inventors of the present invention, the parasitic capacitance added to the lines 26 when the pattern of the lines 26 and the grid-shaped pattern of the dummy pedestals 8B coincide with each other and the center lines of the dummy pedestals 8B coincide with the corresponding center lines of the lines 26 is smaller than that added to the lines 26 when the dummy pedestals 8B are arranged over the entire area of the isolating region Iso by approximately 20%.

FIG. 16 shows parasitic capacitance added to the lines 26 when the pattern of the lines 26 of the first layer and the pattern of the dummy pedestals 8B are shifted relatively by half the interval (the end of the line 26 and that of the dummy pedestals are in coincidence with each other). In FIG. 16, indicated at $C_4$ is a parasitic capacitance between the lines 26 and the semiconductor substrate 1, indicated at $C_5$ is a parasitic capacitance between the lines 26 and the dummy pedestal 8B in the vicinity of the same line 26, and indicated at $C_5$ is a parasitic capacitance between the line 26 and the dummy pedestal 8B located farthest from the same line 26. Although the parasitic capacitance $C_4$ is very small, a parasitic capacitance added to the line 26 includes the two parasitic capacitances $C_5$ in addition to the parasitic capacitance $C_4$, and hence the parasitic capacitance added to the line 26 is large. The parasitic capacitance $C_5$ is small. Accordingly, the parasitic capacitance $C_5$ is dominant among the parasitic capacitance added to the line 26. and hence the the parasitic capacitance added to the line 26 is greater than that shown in FIG. 15. In FIG. 16, the parasitic capacitance added to the lines 26 is smaller than that added to the lines 26 when the dummy pedestals 8B are arranged over the entire area of the isolating region Iso.

Thus, in this semiconductor integrated circuit LSI having semiconductor elements including the transistors and the other elements formed in the active region Act on the major surface of the semiconductor substrate 1 and connected to the electrodes 8A and 19, layer insulating films 11, 21 and 24 formed over the semiconductor elements, and lines 26 formed on the layer insulating films 11, 21 and 24, the dummy pedestals 8B are arranged in the shape of a grid between the semiconductor substrate 1 and the layer insulating films in the isolating region Iso between the semiconductor elements, and thereby the height of the steps in the surface of the layer insulating film 24 attributable to the protrusion of the semiconductor elements and the electrodes is reduced to smooth the surface of the layer insulating film 24. Consequently, the step coverage of the lines 26 is improved and the electrical reliability of the lines 26 is enhanced. Furthermore, since the parasitic capacitance added to the lines 26 can be reduced by positively producing a parasitic capacitance smaller than the parasitic capacitance between the lines 26 and the dummy pedestals 8B between the lines 26 and the semiconductor substrate 1, the signal transfer speed of the lines is increased and hence the operating speed of the semiconductor integrated circuit LSI is increased. In the bipolar transistor of the SICOS, in particular, the element isolating and insulating film 5 in the isolating region Iso cannot be formed in a large thickness because defects in crystal structure are liable to occur in the corners of the land region 4 of the active region Act. Therefore, the present invention is effective for reducing the parasitic capacitance added to the lines 26 of the first layer. Since the layer insulating films 27, 29 and 31 has a large thickness, for example, in the range of 8000 to 12,000Å, the parasitic capacitances added respectively to the lines 28, 30 and 32 are small.

Furthermore, in the semiconductor integrated circuit LSI, lines 26 of the first layer are arranged over the dummy pedestals 8B with the intervals thereof substantially in coincidence with those of the dummy pedestals 8B and with the center lines thereof substantially in coincidence with the corresponding center lines of the lines 26, respectively. Accordingly, a dominant parasitic capacitance is produced between the semiconductor substrate 1 and the lines 26 and the parasitic capacitance between the lines 26 and the dummy pedestals 8B can be reduce to the least extent, which increases the signal transfer speed of the lines 26 and thereby the operating speed of the semiconductor integrated circuit LSI is increased.

Furthermore, the thickness of the layer insulating films 11, 21 and 24, particularly the layer insulating film 11, formed between the dummy pedestals 8B and the lines 26 of the first layer is formed in a thickness as large as or greater than the intervals between the dummy pedestals 8B arranged in the shape of a grid. For example, when the intervals between the dummy pedestals 8B is 1 μm, the the thickness of the layer insulating films (basically the layer insulating film 11) is at least 5000Å or above. The layer insulating film 11 having such a thickness surely fills recesses between the dummy pedestals 8B to smooth the surface of the layer insulating film 24. Basically, only a single layer insulating film, i.e., the layer insulating film 11 in this embodiment, is able to electrically isolate the dummy pedestals 8B from the lines 26, and the dummy pedestals 8B from each other. As is obvious from FIG. 14, the interval between the diagonally adjacent square dummy pedestals 8C arranged in the shape of a grid is the maximum interval. Accordingly, it is preferable to form the layer insulating film 11 in a thickness corresponding to $1/\sqrt{2}$ times the interval between the dummy pedestals 8B measured along the width or the direction of extension of the dummy pedestals 8B or greater to smooth the surface of the layer insulating film 24.

Thus, in the semiconductor integrated circuit LSI, forming the layer insulating film (basically, the layer insulating film 11) in a thickness corresponding to $1/\sqrt{2}$ times the interval between the dummy pedestals 8B or greater enables the layer insulating film 11 to fill gaps between the dummy pedestals 8B satisfactorily so that the surface of the layer insulating film 24 is smoothed, which improves the step coverage of the lines 26 and further enhances the electrical reliability of the lines 26. Since the apparent thickness of the layer insulating film 11 is increased by a value corresponding to the thickness of the film forming the dummy pedestals 8B, the parasitic capacitance between the lines 26 and the semiconductor substrate 1 can further be reduced and thereby the parasitic capacitance added to the lines is reduced. Consequently, the signal transfer speed of the lines 26 is increased and thereby the operating speed of the semiconductor integrated circuit LSI is increased still further.

A concrete method of manufacturing the semiconductor integrated circuit LSI will be described briefly hereinafter with reference to FIGS. 17 through 32 showing different stages of the method.

The $p^-$-type semiconductor substrate 1, i.e., a single crystal silicon substrate, is prepared.

Then, a doping mask 35 is formed over the major surface of the semiconductor substrate 1 in the active region Act between the semiconductor elements, and in the isolating region Iso. The doping mask 35 is a silicon dioxide film formed by subjecting the major surface of the semiconductor substrate 1 to a selective heat-oxidizing process.

Then, the major surface of the semiconductor substrate 1 is doped with an n-type impurity such as Sb, P or As, for example by a thermal diffusion process using the doping mask 35 to form the buried $n^+$-type semiconductor regions 2 as shown in FIG. 17.

Then, the doping mask 35 and other silicon oxide films are removed from the major surface of the semiconductor substrate 1, and then the $n^-$-type epitaxial layer 3 is formed over the entire area of the major surface of the semiconductor substrate 1 in a thickness, for example in the range of 0.6 to 0.8 $\mu$m as shown in FIG. 18.

Then, masks 36, 37 and 38 are formed sequentially in that order over the epitaxial layer 3 in the semiconductor element forming regions in the active region Act. The mask 36 is formed by patterning a silicon dioxide film of a thickness in the range of 400 to 600Å formed by subjecting the surface of the epitaxial layer 3, for example, to heat oxidation. The mask 37 formed over the mask 36 is formed by patterning, for example, a silicon nitride film of a thickness in the range of 800 to 1200Å formed by a CVD process or a sputtering process mainly for use as an antioxidation mask. The mask 36 is provided to absorb stress which acts on the semiconductor substrate 1 in forming the mask 37. The mask 38 is formed, for example, by patterning a silicon dioxide film of a thickness in the range of 7000 to 8000Å formed by a CVD process over the mask 37. The mask 38 is used mainly as an etching mask. The masks 36, 37 and 38 are formed in the same pattern by sequentially patterning the film for the mask 38, the film for the mask 37 and the film for the mask 36 in that order.

Figure 19:
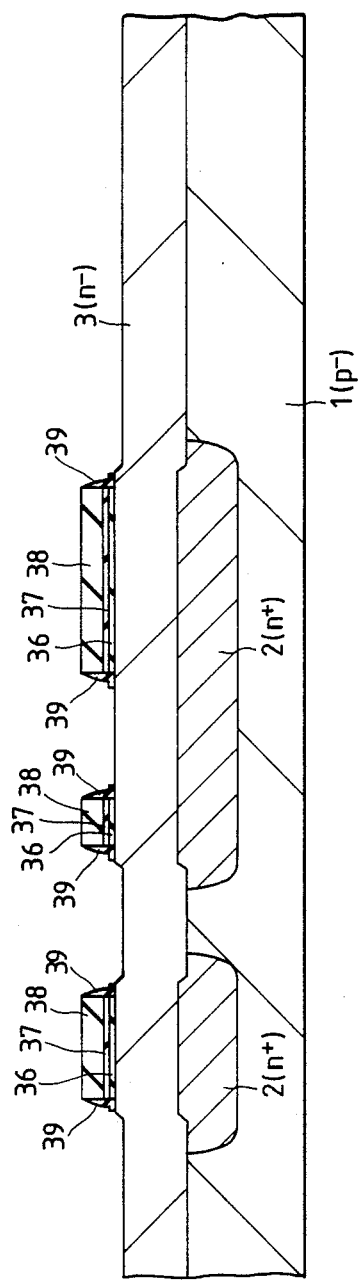

Then, as shown in FIG. 19, the respective side walls of the masks 36, 37 and 38 are masked by masks 39 mainly for etching and for preventing oxidation. The masks 39 can be formed, for example, by sequentially forming a silicon nitride film and a polycrystalline silicon film in layers and subjecting the layers of the silicon nitride film and the polycrystalline silicon film to an anisotropic etching process such as a RIE process. The silicon nitride film serves as an antioxidation mask for a heat oxidation process. The polycrystalline silicon film is formed to improve the step coverage of the silicon nitride film.

Then, the epitaxial layer 3 between the semiconductor elements in the active region Act, and in the isolating region Iso is removed by an etching process using the masks 38 and 39 to form the land regions 4 of the epitaxial layer 3. In the etching process, first the epitaxial layer 3 is etched by an anisotropic etching process to etch the epitaxial layer 3 at a high accuracy, and then the epitaxial layer 3 is etched by an isotropic etching process in the final stage of the etching process to remove the sharp corners of the land regions 4.

Figure 20:
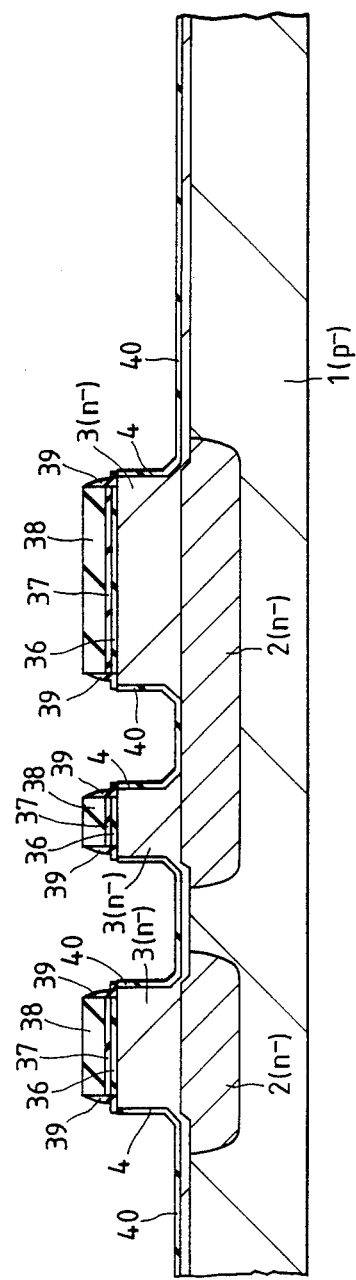

Then, as shown in FIG. 20, silicon dioxide films 40 are formed over the exposed surfaces of the epitaxial layer 3 by a heat oxidation process using mainly the masks 39. The silicon dioxide films 40 are formed to remove damages formed in the exposed surfaces of the epitaxial layer 3 in etching the epitaxial layer 3 to form the land regions 4.

Then, the silicon dioxide films 40 and the masks 39 are removed sequentially.

Then, masks 41 are formed over the side surfaces of the masks 36, 37 and 38 and over the side surfaces of the land regions 4 (the exposed surfaces of the epitaxial layer 3) mainly for protecting those side surfaces from heat oxidation. The masks 41 are formed by etching a layered film of, for example, a silicon nitride film and a polycrystalline silicon film by an anisotropic etching process such as a RIE process.

Then, portions of the major surface of the semiconductor substrate 1 between the semiconductor elements in the active region Act, and in the isolating region Iso are doped with a p-type impurity by an ion implanting process using, for example, an ion beam of boron ion density on the order of $10^{13}$ atoms/cm$^2$ ion density and a field intensity in the range of 60 to 80 KeV, and then the p-type impurity is diffused to form the $p^+$-type semiconductor regions 6.

Figure 21:
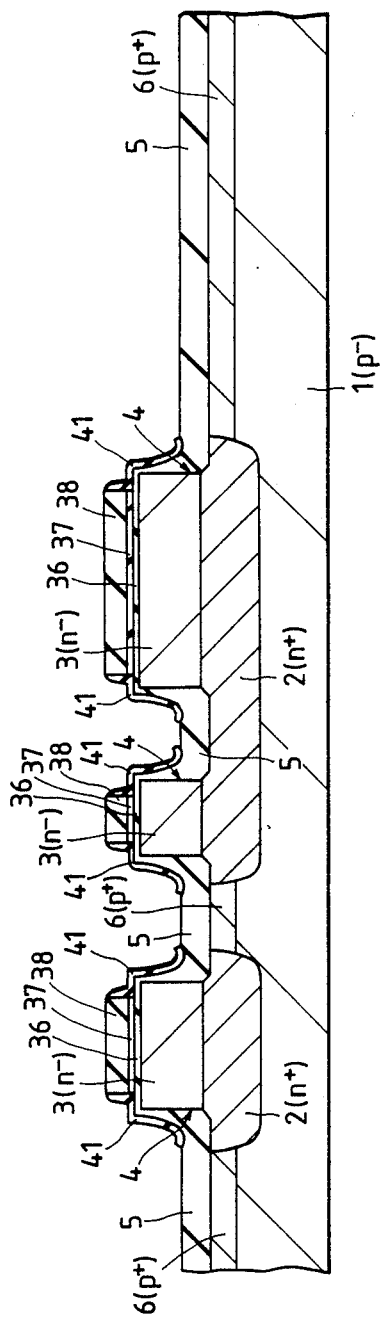

Then, as shown in FIG. 21, element isolating and insulating films 5 are formed over the side surfaces of the land regions 4 and over the surfaces of the epitaxial layer 3 (or the semiconductor substrate 1) in portions other than the side surfaces of the land regions 4 by a heat oxidation process using the masks 41. The element isolating and insulating film 5 is a comparatively thin silicon dioxide film having a thickness in the range of 3000 to 5000Å for preventing the development of faults in the crystal structure in the corners of the land regions 4. The masks 41 are removed selectively after the element isolating and insulating films 5 have been formed.

Figure 22:
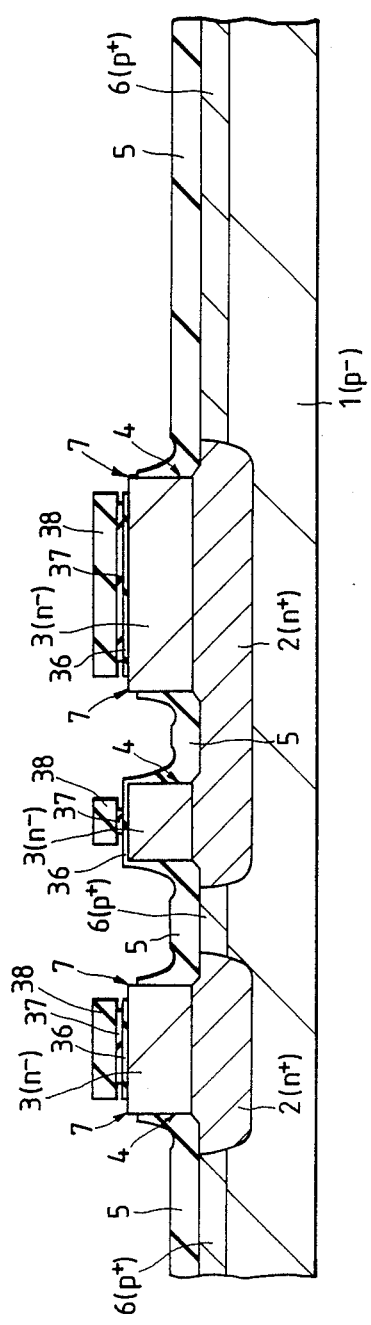

Then, as shown in FIG. 22, portions of the masks 36 or the element isolating and insulating films 5 coating the corners, i.e., the shoulders, of the land regions 4 in regions for forming the base regions of the bipolar transistors Tr are removed to form the connecting holes 7. The base regions 9 and the base electrodes 8A are connected through the connecting holes 7.

Then, the first electrode forming layer is formed over the entire area of the surface of the semiconductor substrate 1 including the element isolating and insulating films 5 and the masks 38, for example, by a CVD process. The first electrode forming layer is a polycrystalline silicon film having a thickness in the range of 6000 to 8000Å. The first electrode forming layer is partly in contact with the portions of the epitaxial layer 3 in the shoulders of the land regions 4 through the connecting holes 7.

Then, a thin silicon oxide film is formed over the first electrode forming layer, and then the first electrode forming layer is doped with a p-type impurity through the silicon oxide film. The thin silicon dioxide film is provided to prevent spoiling the first electrode forming layer by heavy metals and damaging the surface of the first electrode forming layer in doping the first electrode forming layer. The p-type impurity is implanted in the first electrode forming layer by an ion implanting process using a boron ion beam of a boron ion density on the order of $10^{16}$ atoms/cm$^2$ and a field intensity in the range of 30 to 50 KeV. The first electrode forming layer is doped with the p-type impurity to the resistance thereof. The p-type impurity implanted in the first electrode forming layer diffuses through the connecting holes 7 into the major surfaces of the epitaxial layers 3 in the land regions 4 to form the p$^+$-type semiconductor regions 9 in the land regions 4. Each p$^+$-type semiconductor region 9 self aligns with the connecting hole 7. The p$^+$-type semiconductor regions form part of the base regions.

Then, a silicon dioxide film, not shown, is formed over the entire area of the first electrode forming layer, and then a photoresist film, not shown, is formed over the silicon dioxide film. Then, the uppermost photoresist film, the silicon dioxide film and the first electrode forming layer are etched sequentially (etch back) by an anisotropic etching process to smooth the surface by removing the first electrode forming layer except portions thereof filling recesses between the land regions 4, and then the masks coating the land regions 4 are removed by an isotropic etching process.

Figure 23:
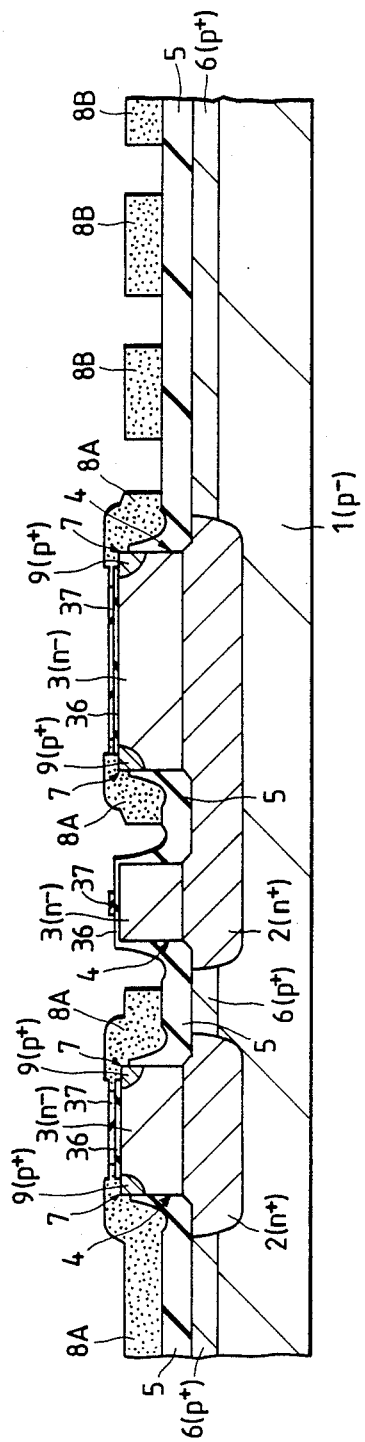

Then, as shown in FIG. 23, the first electrode forming layer in the active region Act and the first electrode forming layer in the isolating region Iso are etched selectively and simultaneously in predetermined patterns to form the base electrodes 8A and the dummy pedestals 8C in the active region Act and to form the dummy pedestals 8B in the isolating region Iso. An anisotropic etching process is employed to etch the first electrode forming layer at a high accuracy in a predetermined pattern, and an isotropic etching process is employed to mitigate the shape of the steps in the first electrode forming layer.

Thus, the base electrodes 8A connected to the semiconductor elements including the transistors Tr formed in the active region Act on the major surface of the semiconductor substrate 1, and the dummy pedestals 8B arranged in the shape of a grid are formed through the same process to omit a process for forming the dummy pedestals 8B.

Figure 24:
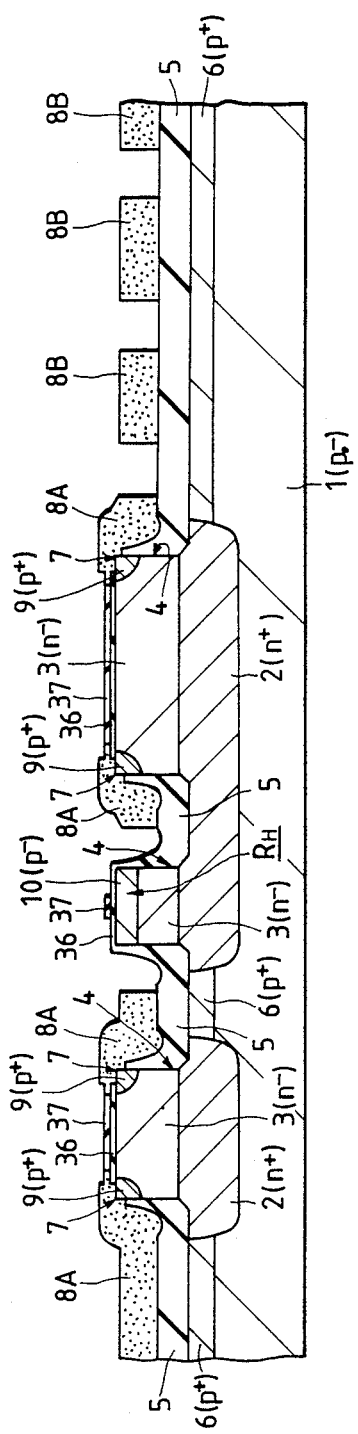

Then, as shown in FIG. 24, in the region for forming the high resistance R$_H$ of the memory cell, the p$^-$-type semiconductor region 10 is formed in the major surface of the epitaxial layer 3 of the land region 4, for example by an ion implanting process using a boron ion beam of a boron ion density on the order of $10^{13}$ atoms/cm$^2$ and a field intensity in the range of 30 to 50 KeV. The high resistance R$_H$ is completed by forming the p$^-$-type semiconductor region 10. The high resistance R$_H$ may be formed prior to etching the first electrode forming layer for forming the base electrodes 8A.

Figure 25:
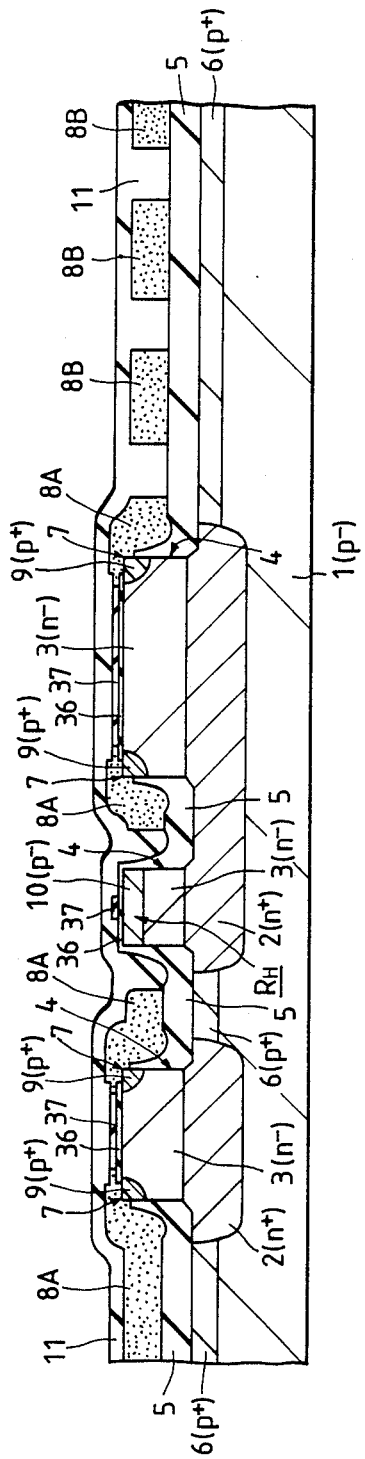

Then, as shown in FIG. 25, the layer insulating film 11 is formed over the entire surface of the semiconductor substrate 1 including the base electrodes 8A, the dummy pedestals 8B and the dummy pedestals 8C to smooth the upper surface. The layer insulating film 11 is, for example, a composite film consisting of a silicon dioxide film formed by a CVD process and a silicon dioxide film formed over the former by a SOG process. The thickness of the layer insulating film 11 in the isolating region Iso is greater than half the interval between the dummy pedestals 8B. For example, the thickness of the lower silicon dioxide film of the layer insulating film 11 is in the range of 7000 to 8000Å and that of the upper silicon dioxide film of the same is in the range of 1000 to 1500Å. The upper silicon dioxide film formed by applying silicon dioxide to the lower silicon dioxide film by a SOG process may be densified and etched by an anisotropic etching process to further smooth the surface of the layer insulating film 11. The greater the thickness of the layer insulating film 11, the higher is the smoothness of the surface of the layer insulating film 11, whereas the greater the thickness of the layer insulating film 11, the greater etching load in forming the connecting holes 12. Accordingly, as mentioned above, the layer insulating film 11 formed in a large thickness, namely, a thickness greater than half the interval between the dummy pedestals 8B, is etched to reduce the thickness of the layer insulating film 11.

Then, a mask 42 is formed over the entire surface of the layer insulating film 11 for etching the layer insulating film 11 and for protecting portions of the layer insulating film 11 from heat oxidation. The mask is formed of a composite film of a silicon dioxide film formed by a CVD process, and a silicon nitride film formed by a CVD process over the silicon dioxide film.

Then, portions of the mask 42 is removed selectively in regions for forming the base regions of the bipolar transistors Tr, and for forming the Schottky barrier diode SBD. Then, the layer insulating film 11 is removed using the residual portions of the mask 42 to form the connecting holes 12. The connecting holes in the active region Act are formed so that a portion of each base electrode 8A to be connected to the base region is exposed.

Figure 26:
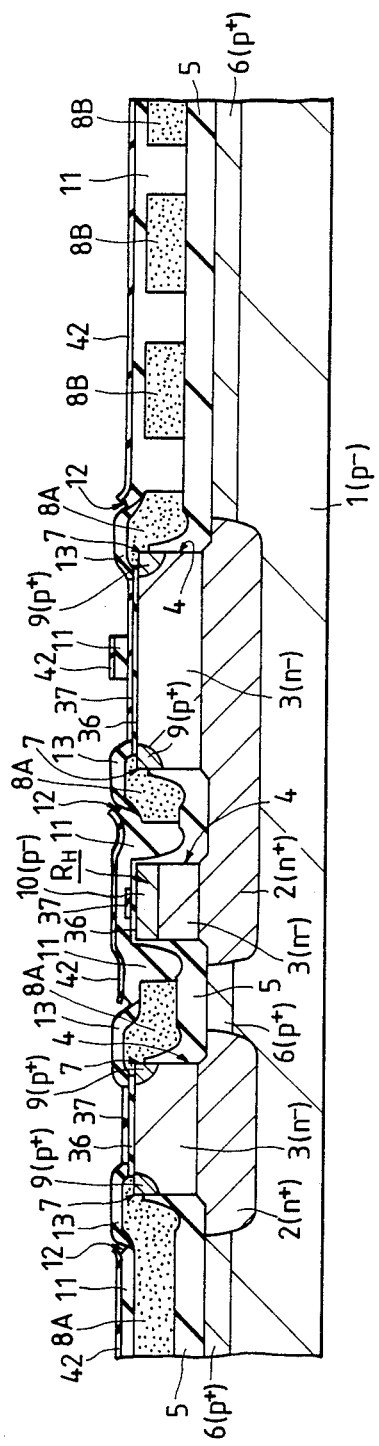

Then, as shown in FIG. 26, the layer insulating film 13 is formed over part of the exposed surface of each base electrode 8A using the mask 42, and the mask 37 formed on the land regions 4. The layer insulating film 13 is a silicon oxide film formed by subjecting the surface of the base electrode 8A to heat oxidation and having a thickness, for example, in the range of 3000 to 4000Å. The layer insulating film 13 isolates electrically the base electrodes 8A, the emitter electrodes 19 and the collector electrodes 19 from each other. The mask 42 shields the base electrodes 8A and the element isolating and insulating film 5 during a hot oxidation process so that only a selected portion of each base electrode 8A is heat-oxidized and so that oxygen will not penetrate through portions of the element isolating and insulating film 5 directly below the end portions of the base electrodes 8A and portions of the same in the vicinity of the end portions of the of the base electrodes 8A into the semiconductor substrate 1. If oxygen penetrates into the semiconductor substrate 1, the surface of the same is oxidized and faults are liable to develop in the crystal structure of the semiconductor substrate 1.

Figure 27:
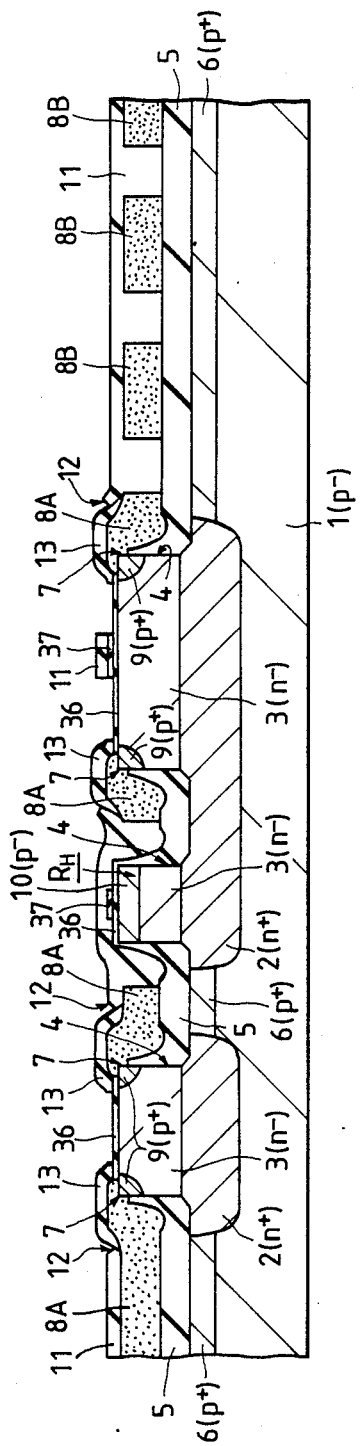

Then, as shown in FIG. 27, the mask 42, and the mask 37 formed on the land regions 4 are removed simultaneously.

Then, intrinsic base regions, not shown, for the component npn-type bipolar transistors of the SICOS, other than the forward bipolar transistor Tr$_1$ and the reverse bipolar transistor Tr$_2$, of the logic circuit L and the peripheral circuits including a decoder and the like of the memory unit M are formed. The intrinsic base region of the bipolar transistor, similarly to those of the forward bipolar transistor $Tr_1$ and the reverse bipolar transistor $Tr_2$, is formed in the major surface of the epitaxial layer 3 of the land region 4. The intrinsic base region is formed, for example, by an ion implanting process using a boron ion beam of a boron ion density on the order of $10^{13}$ atoms/cm$^2$ and a field intensity in the range of 15 to 30 KeV.

Figure 28:
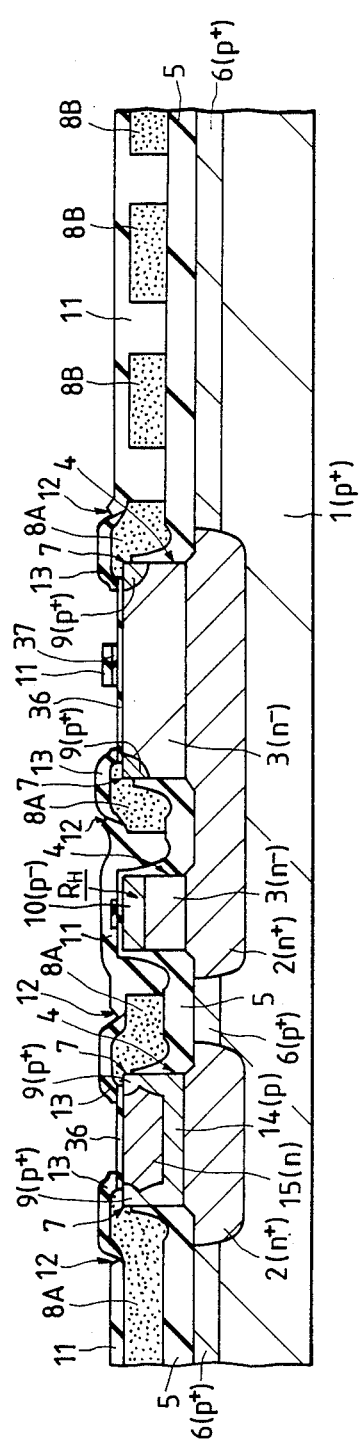

Then, as shown in FIG. 28, the p-type semiconductor region 14 and the n-type semiconductor region 15 are formed in layers over the major surface of the epitaxial layer 3 of the land region 4 in the region for forming the reverse bipolar transistor $Tr_2$. The p-type semiconductor region 14 are used as a base region and a potential barrier region against minority carriers produced in the semiconductor substrate 1. The p-type semiconductor region 14 can be formed by an ion implanting process using a boron ion beam of a boron ion density on the order of $10^{13}$ atoms/cm$^2$ and a field intensity in the range of 140 to 160 KeV. The n-type semiconductor region 15 is used as a part of the collector region. The n-type semiconductor region 15 can be formed by an ion implanting process using a phosphor ion beam of a phosphor ion density on the order of $10^{13}$ atoms/cm$^2$ and a field intensity in the range of 140 to 160 KeV. The p-type impurity for forming the p-type semiconductor region 14 and the n-type impurity for forming the n-type semiconductor region 15 are implanted in regions defined by the layer insulating film 13 formed over the surface of the base electrodes 8A.

Figure 29:
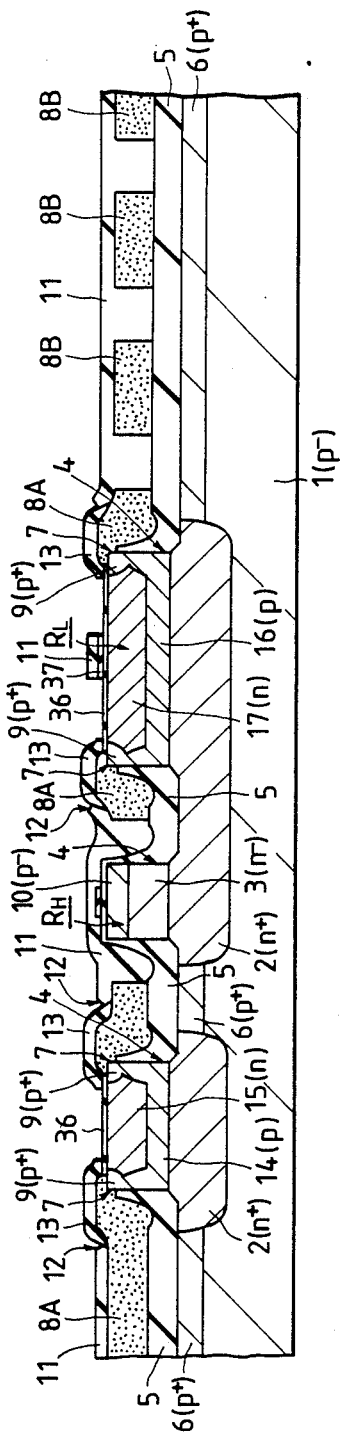

Then, the p-type semiconductor regions 16 and the n-type semiconductor regions 17 are formed sequentially over portions of the major surface of the epitaxial layer 3 on the land regions 4 in regions for forming the forward bipolar transistor $Tr_1$, the low resistance $R_L$ and the Schottky barrier diode SBD as shown in FIG. 29. The p-type semiconductor region 16 serves as base regions, and a potential barrier region against minority carriers produced in the semiconductor substrate 1 by α rays. The p-type semiconductor region 16 can be formed by an ion implanting process using a boron ion beam of a boron ion density on the order of $10^{13}$ atoms/cm$^2$ and a field intensity in the range of 80 to 100 KeV. The n-type semiconductor region 17 is used as a portion of the emitter region, the low resistance $R_L$ and a portion (cathode region) of the Schottky barrier diode SBD. The n-type semiconductor region 17 can be formed by an ion implanting process using a phosphor ion beam of a phosphor ion density on the order of $10^{13}$ atoms/cm$^2$ and a field intensity in the range of 170 to 190 KeV.

Then, portions of the mask 36 on the land regions 4 in the regions respectively for forming the forward bipolar transistor $Tr_1$ and the reverse bipolar transistor $Tr_2$ are removed to form the connecting holes 18 (emitter openings and collector openings). Portions of the mask 36 in regions defined by the layer insulating film 13 on the surface of the base electrodes 8A are removed.

Then, the second electrode forming layer is formed over the entire surface of the semiconductor substrate 1. The second electrode forming layer is a polycrystalline silicon film of a thickness in the range of 2000 to 3000Å formed, for example, by a CVD process. Portions of the second electrode forming layer are in contact through the connecting holes 18 respectively with the n-type semiconductor regions 15 and 17.

Then, the surface of the second electrode forming layer is oxidized to form a thin silicon dioxide film, and then the second electrode forming layer is doped through the thin silicon oxide film with an n-type impurity, for example, by an ion implanting process using an arsenic ion beam of an arsenic ion density on the order of $10^{16}$ atoms/cm$^2$ and a field intensity in the range of 70 to 90 KeV.

Then, the second electrode forming layer is subjected to an activating heat treatment to activate the n-type impurity implanted therein, whereby the n-type impurity implanted through the connecting holes 18 in the second electrode forming layer is caused to diffuse into the respective major surfaces of the n-type semiconductor regions 15 and 17. The n-type impurity diffused into the major surface of the n-type semiconductor region 15 forms an n$^+$-type semiconductor region 20 forming a portion of the collector region of the reverse bipolar transistor $Tr_2$. The n-type impurity diffused in the major surface of the n-type semiconductor region 17 forms an n$^+$-type semiconductor region 20 forming a portion of the emitter region of the forward bipolar transistor $Tr_1$. Thus, the forward bipolar transistor $Tr_1$ and the reverse bipolar transistor $Tr_2$ are completed. Since the diffusing speed of As used as an n-type impurity is lower than that of P, a thin emitter junction can be formed by using As as an n-type impurity.

Figure 30:
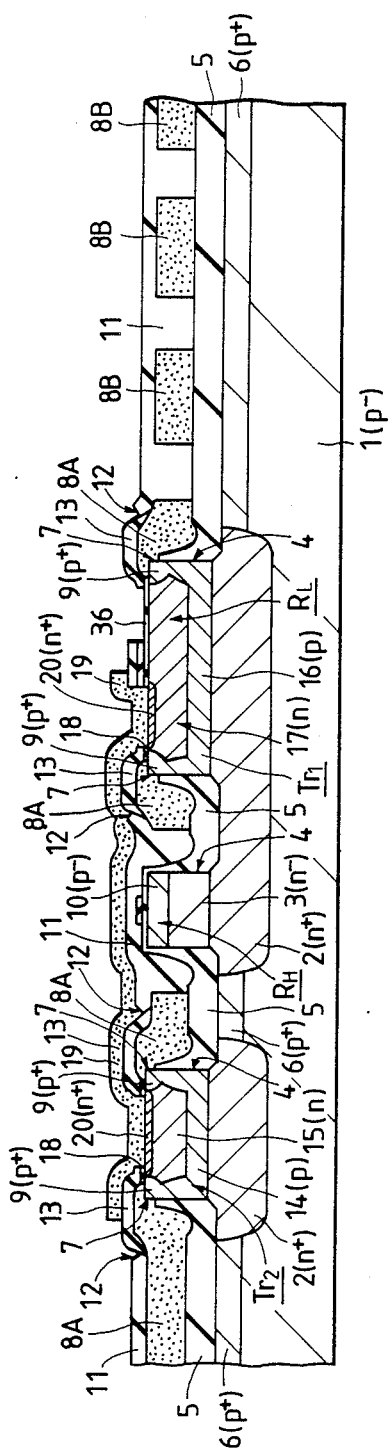

Then, as shown in FIG. 30, the second electrode forming layer is etched in a predetermined pattern to form the emitter electrode 19 and the collector electrode 19. The emitter electrode 19 is connected to the emitter region (n$^+$-type semiconductor region 20) of the forward bipolar transistor $Tr_1$, and the collector electrode 19 is connected to the collector region (n$^+$-type semiconductor region 20) of the reverse bipolar transistor $Tr_2$.

Then, the layer insulating film 21 is formed over the entire surface of the semiconductor substrate 1 including the surfaces of the emitter electrode 19 and the collector electrode 19. The layer insulating film 21 is a composite film of a thickness in the range of 3000 to 5000Å consisting of, for example, a PSG film formed by a CVD process and a silicon dioxide film applied to the surface of the PSG film by a SOG process.

Then, in the region for forming the capacitance element Ca, a portion of the layer insulating film 21 is removed selectively to form an opening 22 for exposing the electrode 19 in the lower layer.

Figure 31:
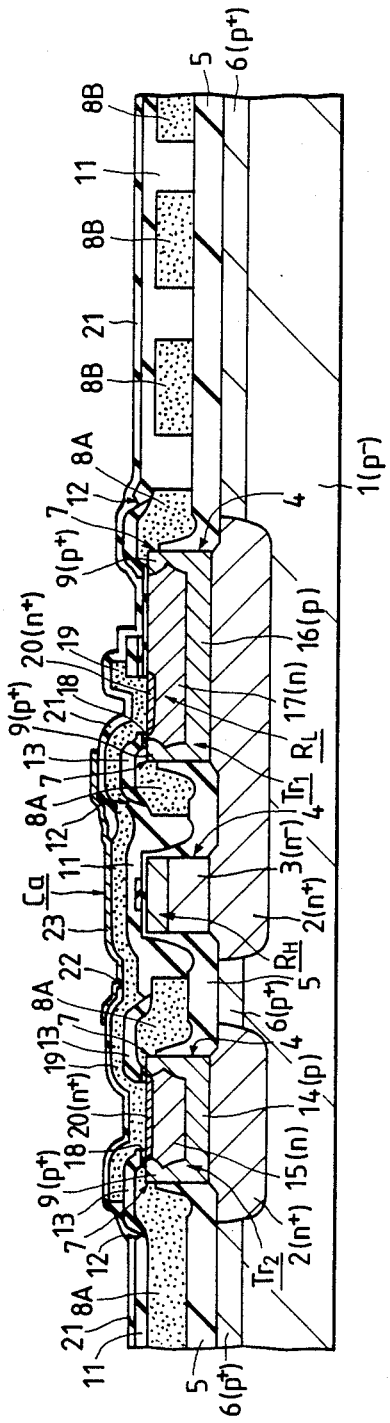

Then, the dielectric film 23 and the upper electrode 23 are formed sequentially above the lower electrode 19 so as to be in contact with the surface of the lower electrode 19 through the opening 22. Thus, the capacitance element Ca is completed as shown in FIG. 31. The dielectric film 23 is a $Ta_2O_5$ film of a thickness in the range of 70 to 100Å formed by a sputtering process. The upper electrode 23 is a $MoSi_2$ film of a thickness in the range of 1500 to 2500Å formed by a sputtering process. The dielectric film 23 and the upper electrode 23 are formed in the same pattern.

Then, the layer insulating film 24 is formed over the entire surface of the semiconductor substrate 1 including the capacitance element Ca. The layer insulating film 24 is, for example, a PSG film of a thickness in the range of 2500 to 3500Å formed by a CVD process.

Then, portions of the layer insulating film 24 corresponding to the emitter electrode 19, the collector electrode 19, the base electrode 8A and the n-type semiconductor region 17 are removed to form connecting holes 25.

Then, a platinum film is formed over the entire surface of the semiconductor substrate 1 so that the platinum film is in contact at least with the surface of the n-type semiconductor region 17 for forming the Schottky barrier diode SBD through the connecting holes 25. Then the semifinished semiconductor integrated circuit LSI is subjected to a heat treatment to make the platinum film react with the n-type semiconductor region 17 to form a platinum silicide film, not shown, over the major surface of the n-type semiconductor region 17 in a thickness of several hundreds angstroms. Portions of the platinum film other than that converted into the platinum silicide film are removed selectively. The platinum silicide film is used as the anode region of the Schottky barrier diode SBD. Thus, the Schottky barrier diode SBD is completed.

Figure 32:
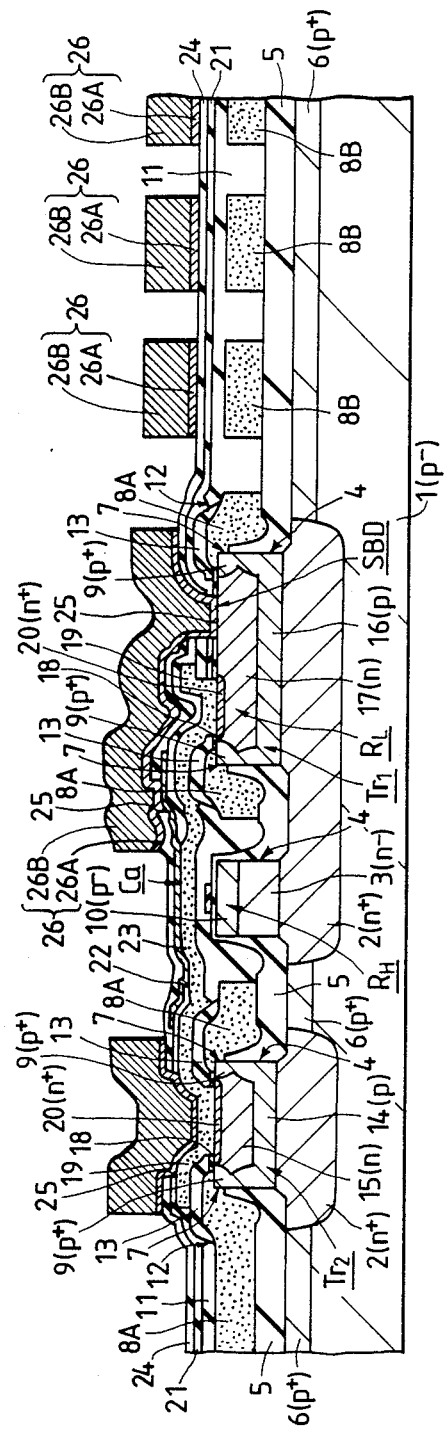

Then, as shown in FIG. 32, the lines 26 of the first layer are formed so as to be in contact through the connecting holes 25 with the emitter electrode 19 and the n-type semiconductor region 17 (practically, in contact through the platinum silicide film). The lines 26 are formed of a composite film consisting, for example, of a barrier metal film 26A formed by a sputtering process and an aluminum film 26B formed by a sputtering process over the barrier metal film 26A. The barrier metal film has a thickness in the range of 800 to 1200Å and the aluminum film 26B has a thickness in the range of 8000 to 12,000Å.

Then, the layer insulating film 27, the lines 28 of the second layer, the layer insulating film 29, the lines 30 of the third layer, the layer insulating film 31 and the lines 32 of the fourth layer are formed sequentially. The lines 28, 30 and 32 are formed, for example, of an aluminum alloy film containing Cu and/or Si. The respective thicknesses of the lines 28, 30 and 32 are in the ranges of 8000 to 12,000Å, 10,000 to 14,000Å and 18,000 to 24,000Å. The layer insulating films 27, 29 and 31 are silicon dioxide films, respectively, formed, for example, by a CVD process.

Then, the passivation film 33 is formed over the entire surface of the semifinished semiconductor integrate circuit including the lines 32 of the fourth layer to complete the semiconductor integrated circuit LSI shown in FIG. 11. The passivation film 33 is a PSG film formed by a CVD process or a silane film formed by a plasma CVD process.

The dummy pedestals 8B may be formed in the isolation region Iso in a grid arrangement through the same process by the same conductive layer for forming the emitter electrodes 19.

As apparent from the foregoing description, in the second embodiment of the present invention, the step coverage of the lines is improved, the electrical reliability of the lines 26 is enhanced, and the parasitic capacitance added to the lines 26 is reduced to increase the operating speed of the semiconductor integrated circuit LSI.

Furthermore, a process for forming the dummy pedestals 8B for smoothing the ground for the lines 26 can be omitted to reduce the steps of the process for manufacturing the semiconductor integrated circuit LSI.

Still further, the present invention is applied particularly effectively to a semiconductor integrated circuit LSI including bipolar transistors of the SICOS having the land regions 4. However, the present invention is applicable also to a semiconductor integrated circuit of a structure including bipolar transistors of a structure having electrodes connected to the active regions of the semiconductor elements, other than those of the SICOS. For example, the present invention is applicable to a semiconductor integrated circuit of a SST (super self aligned technology) structure.

Third Embodiment

In the third embodiment, the multilayer wiring structure of the semiconductor integrated circuit LSI including the bipolar transistors of the SICOS in the second embodiment is smoothed.

Figure 33:
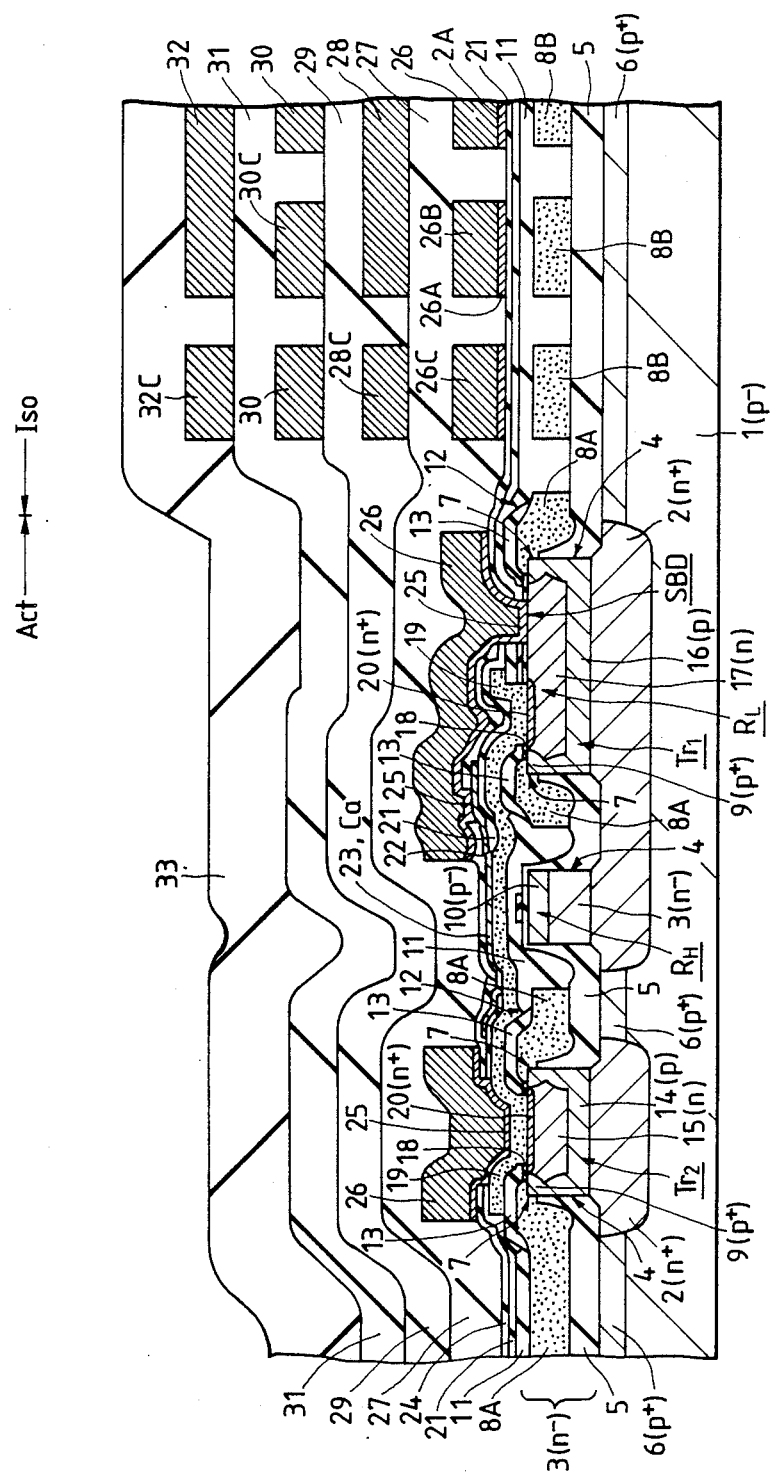
FIG. 33 is a sectional view of an essential portion of a bipolar transistor of SICOS incorporated into a semiconductor integrated circuit, in a third embodiment, according to the present invention.
Figure 34:
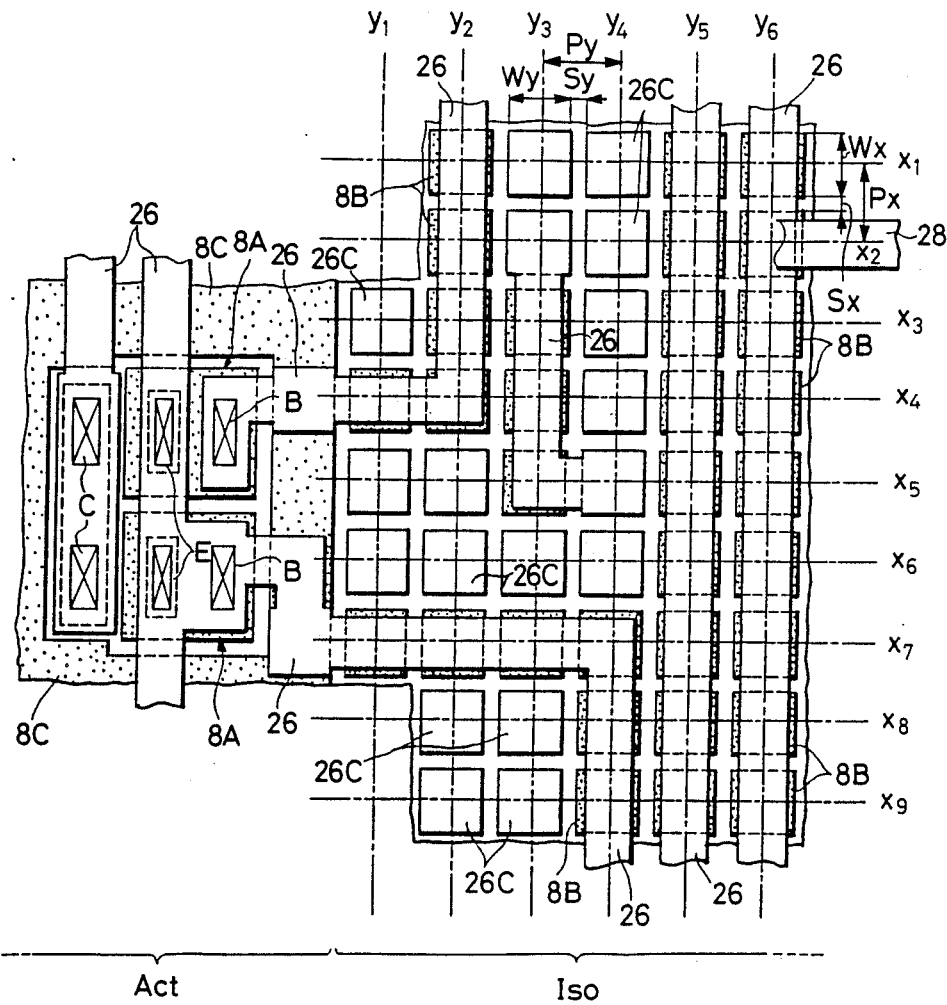
FIG. 34 is an enlarged plan view of an essential portion of the semiconductor integrated circuit of FIG. 33.

Referring to FIGS. 33 and 34 illustrating a semiconductor integrated circuit LSI including bipolar transistors of the SICOS, in a third embodiment, according to the present invention, the semiconductor integrated circuit LSI in the third embodiment, similarly to that in the second embodiment, has an isolating region Iso (though not limited to the isolating region Iso) having a four-layer wiring construction consisting of a first layer for lines 26, a second layer for lines 28, a third layer for lines 30, and a fourth layer for lines 32.

The respective arrangement of the lines 26, 28, 30 and 32 are determined automatically by a computer-aided automatic wiring layout system (DA). As shown in FIG. 34, the lines are arranged by the automatic wiring layout system in a grid of virtual wiring center lines (alternate long and short dash lines) $x_i$ and $y_i$ ($i=1, 2, \ldots, n$), which are imaginary lines for defining the position of each line by a computer. The center lines $x_i$ extend in lines, while the center lines $y_i$ extend in rows substantially perpendicularly to the center lines $x_i$.

Interval between the adjacent center lines $x_i$ corresponds to the line pitch Px of lines extending in the direction of line, namely, the pitch of wiring channel regions. The line pitch Px is, for example, 5 μm. The line width Wx of the lines extending in the direction of line is divided in halves by the center line $x_i$. The line width Wx is a minimum possible line width or greater. The minimum possible line width is dependent on the peel strength of a photoresist film for patterning the lines. The line width Wx is, for example, 3 μm. Interval Sx between the adjacent lines extending in the direction of line is a minimum possible line interval or greater. The minimum line interval is dependent on the processing accuracy of the manufacturing process. The line interval Sx is, for example, 1 μm. The sum of the line width Wx and the line interval Sx is smaller than the line pitch Px. The wiring channel regions (regions for actual wiring) for the lines extending in the direction of line is defined by the line pitch Px, the line width Wx and the line interval Sx.

Similarly, interval between the center lines $y_i$ of the lines extending in the direction of row corresponds to the line pitch Py of the same lines. The line pitch Py is, for example, 5 μm. The line width Wy of the lines extending in the direction of row is divided in halves by the center line $y_i$. The line width Wy is a minimum possible line width or greater. The line width Wy is, for example, 3 μm. The line interval Sy between the adjacent lines extending in the direction of row is a minimum line interval or greater. The line interval Sy is, for example, 1 μm. The sum of the line width Wy and the line interval Sy is smaller than the line pitch Py. Wiring channel regions for the lines extending in the direction of row is defined by the line pitch Py, the line width Wy and the line interval Sy.

As shown by a layout pattern for the lines 26 of the first layer in FIG. 34, the lines 26 of the first layer are arranged automatically by the automatic wiring layout system in the first wiring channel regions defined by the center lines $x_i$, in the second wiring channel regions defined by the center lines $y_i$ or in both the first and second wiring channel regions defined by the center lines $x_i$ and $y_i$. Dummy pedestals 26C are arranged at intersections of the first and second wiring channel regions, namely, intersections of the center lines $x_i$ and the center lines $y_i$. The dummy pedestals 26C and the lines 26 of the first layer are formed in the same conductive layer in the same process.

Substantially similarly to the dummy pedestals 8B arranged in a grid in the second embodiment, the dummy pedestals 26C are formed in a square shape of a size Wx×Wx capable of being contained in the intersecting area of the wiring channel regions. That is, the dummy pedestals 26C can be formed in a very small size corresponding to the minimum possible line width. The dummy pedestals 26C are provided in all the intersecting areas of the wiring channel regions in which none of the lines 26 is provided. The dummy pedestals 26C are arranged at intervals substantially the same as the line intervals Sx and Sy and are isolated from each other and from the lines 26. The shape of the dummy pedestals 26C, similarly to that of the dummy pedestals 8B of the second embodiment, is not limited to a square.

The arrangement of the lines 26 of the first layer and that of the dummy pedestals 26C are determined by the automatic wiring layout system in the following procedure.

Figure 35:
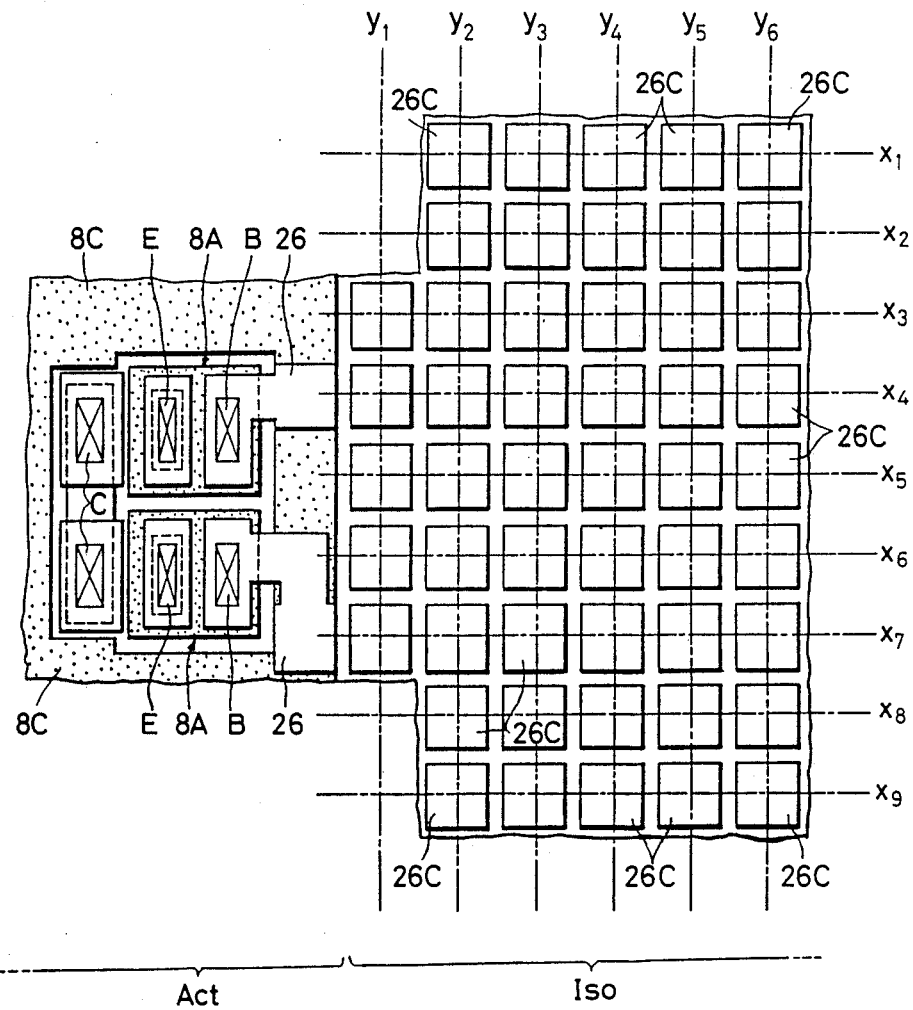
FIG. 35 is a plan view of an essential portion of the semiconductor integrated circuit of FIG. 33, showing an arrangement of dummy pedestals.

First, as shown in FIG. 35, dummy pedestal layout data defining the arrangement of the dummy pedestals 26C is prepared. The dummy pedestals 26C are allocated respectively to all the intersecting areas of the first wiring channel regions defined by the center lines $x_i$ and the second wiring channel regions defined by the center lines $y_i$ in the wiring region of an isolating region Iso.

Figure 36:
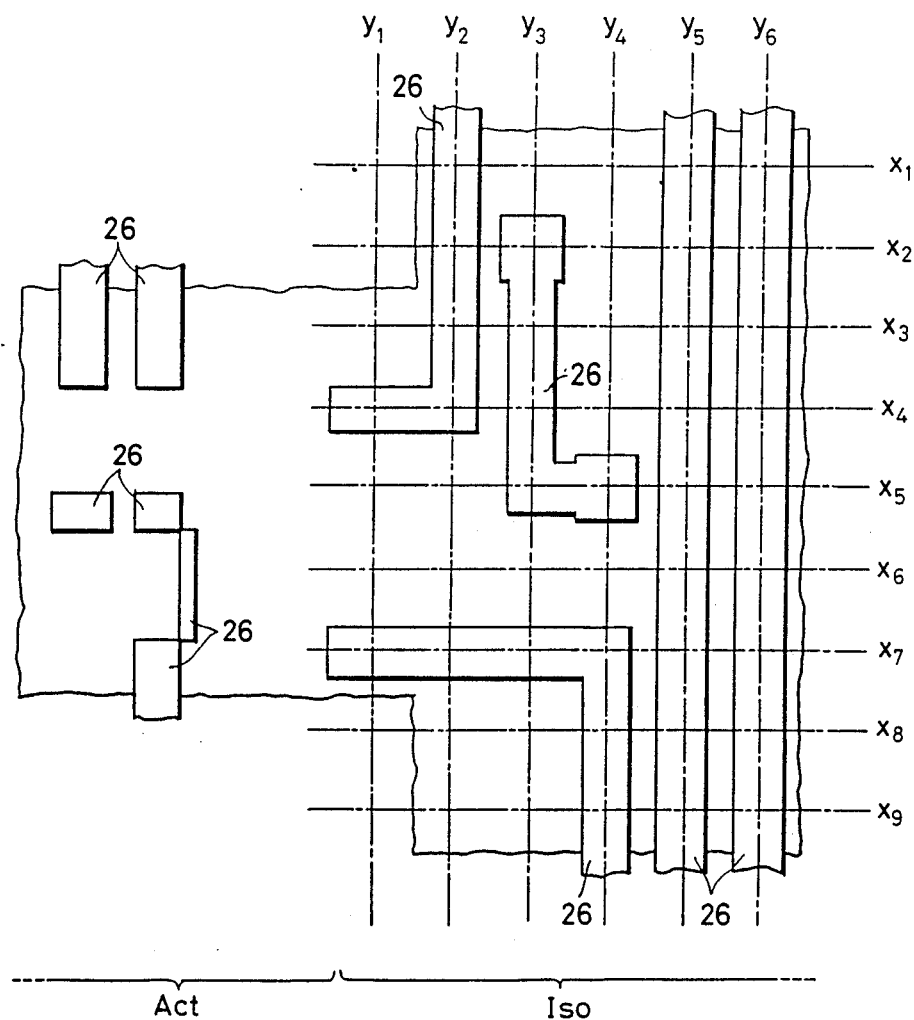
FIG. 36 is a plan view of an essential portion of the semiconductor integrated circuit of FIG. 35, showing an arrangement of lines.

Then, as shown in FIG. 36, line layout data defining the arrangement of the lines 26 of the first layer is prepared to construct a predetermined logical circuit. The lines 26 of the first layer are allocated to the first wiring channel regions defined by the center lines $x_i$, the second wiring channel regions defined by the center lines $y_i$ or wiring channel regions defined by both the center lines $x_i$ and $y_i$. The line layout data may be prepared before the preparation of the dummy pedestal layout data.

Then, the dummy pedestal layout data for the arrangement of the dummy pedestals 26C and the line layout data for the arrangement of the lines 26 are combined by logical sum (OR) to allocate the lines 26 to predetermined wiring channel regions and to allocate the dummy pedestals 26C to the wiring channel regions to which none of the lines 26 is allocated as shown in FIG. 35.

A layer insulating film 27 is formed over the lines 26 of the first layer. Substantially similarly to the layer insulating film 11 formed over the dummy pedestals 8B of a grid arrangement in the second embodiment, the layer insulating film 27 is formed in a thickness greater than half the interval between the adjacent dummy pedestals 26C or between the dummy pedestal 26C and the line 26 of the first layer so that the surface of the layer insulating film 27 is smooth.

As mentioned in the description of the second embodiment, it is also possible to make the surface of the layer insulating film 27 smooth by forming the layer insulating film 27 in a thickness far greater than half the interval between the dummy pedestals 26C or between the dummy pedestal 26C and the line 26 and by etching back the surface of the layer insulating film 27 to smooth the surface of the layer insulating film 27 and to adjust the thickness of the layer insulating film 27 to an optimum thickness. Concretely, first a silicon dioxide film of a thickness in the range of 8000 to 12,000Å is formed by a CVD process, then silicon dioxide is applied to the silicon dioxide film by a SOG process in a thickness in the range of 1000 to 1500Å, and then the upper silicon dioxide film is densified. Then, the surface of the densified upper silicon dioxide film is etched back by a depth in the range of 7000 to 9000Å to smooth the surface of the layer insulating film 27. Undulations in the surface of the layer insulating film 27 thus completed are far smaller than the film thickness (height of steps) of the lines 26 of the first layer. The layer insulating film 27 can be formed so that the thickness of portions of the layer insulating film 27 between the lines 26 of the first layer is greater than that of portions of the same over the lines 26 of the first layer.

Such an arrangement of the lines 26 of the first layer and the dummy pedestals 26C to form the layer insulating film 27 that the surface of the same is smooth is applicable to forming upper wiring layers. As shown in FIG. 33, the lines 28 of the second layer are allocated to desired wiring channel regions and dummy pedestals 28C are allocated to the rest of the wiring channel regions to which none of the lines 28 of the second layer are allocated to form a layer insulating film 29 having a smooth surface over the lines 28 and the dummy pedestals 28C. Similarly, the lines 30 of the third layer are allocated to desired wiring channel regions and dummy pedestals 30C are allocated to the rest of the wiring channels to which none of the lines 30 of the third layer is allocated to form a layer insulating film 31 having a smooth surface over the lines 30 and the dummy pedestals 30C. Basically, any dummy pedestal need not be provided in the fourth layer because no upper wiring layer is formed over the lines 32 of the fourth layer. However, if necessary, dummy pedestals are provided properly in the fourth layer to form a passivation film 33 having a smooth surface over the lines 32 of the fourth layer. In the isolating region Iso under the lines 26 of the first layer, lines and base electrodes 8A are formed by the same conductive layer, and the same dummy pedestals 8B as that of the second embodiment may be arranged in a grid in intersecting areas of the wiring channel regions to which no line is allocated.

Thus, in the semiconductor integrated circuit LSI in the third embodiment having the lines 26 (lower lines) of the first layer, the layer insulating film 27 formed over the lines 26, lines 28 (upper lines) of the second layer formed on the layer insulating film 27, in which at least the lines 26 are arranged in the first wiring channel regions defined by the center lines $x_i$ and in the second wiring channel regions defined by the center lines $y_i$, the dummy pedestals 26C are formed by the same conductive layer as that forming the lines 26 are allocated to the intersecting areas of the first wiring channel regions and the second wiring channel regions where no line 26 of the first layer is placed to smooth the surface of the layer insulating film 27. Consequently, the step coverage of the lines 28 of the second layer is improved, increase in the resistance of the lines 28 is suppressed, the possibility of breakage of the lines 28 is reduced, the electrical reliability of the lines 28 is enhanced, and the lines 26 of the first layer are isolated from the dummy pedestals 26C to reduce the parasitic capacitance added to the lines 26 of the first layer, whereby the signal transfer speed of the lines 26 is increased to increase the operating speed of the semiconductor integrated circuit LSI.

Furthermore, since the dummy pedestals 26C are formed in a small size which enables the dummy pedestals 26C to be arranged within the intersecting areas of the first wiring channels and the second wiring channels, possibility of short circuit between the lines 26 of the first layer through the dummy pedestals 26C and foreign matters is reduced, which enhances the electrical reliability of the semiconductor integrated circuit LSI.

Still further, since the dummy pedestals 26C are formed in a size which enables the dummy pedestals 26C to be placed within the intersecting areas of the first wiring channels and the second wiring channels, the dummy pedestal 26C never intersects the plurality of lines 28 of the second layer and the parasitic capacitance between the line 28 of the second layer and the dummy pedestal 26C, added to the line 28 opposite the former line 28 of the second layer and the dummy pedestal 26C is reduced, whereby the signal transfer speed of the lines 28 of the second layer is increased to increase the operating speed of the semiconductor integrated circuit LSI.

These effects of the present invention apply similarly to the relation between the lines 28 of the second layer (lower layer) and the lines 30 of the third layer (upper layer) and to the relation between the lines 30 of the third layer (lower layer) and the lines 32 of the fourth layer (upper layer).

Furthermore, since the method of manufacturing the semiconductor integrated circuit LSI having the lines 26 of the first layer (lower layer) and the lines 28 of the second layer (upper layer), in which at least the lines 26 of the first layer are extended in the first wiring channel regions or the second wiring channel regions, comprises a step of preparing dummy pedestal layout data for arranging the dummy pedestals 26C formed by the same conductive layer as that forming the lines 26 of the first layer in all the intersecting areas of the first wiring channels and the second wiring channels and preparing line layout data for allocating the lines 26 of the first layer to predetermined first wiring channel regions or in predetermined second wiring channel regions among the wiring channel regions; and a step of combining the dummy pedestal layout data for arranging the dummy pedestals 26C and the line layout data for allocating the lines 26 of the first layer to predetermined wiring channel regions, the lines 26 of the first layer can be allocated to the predetermined first wiring channel regions or the predetermined second wiring channel regions, and the dummy pedestals 26C can be formed in the intersecting areas of the first wiring channels and the second wiring channels to which none of the lines 26 of the first layer is allocated. These effects apply similarly to the lines 28 of the second layer, the lines 30 of the third layer and the lines 32 of the fourth layer.

Although the present invention has been described with reference to the first, second and third embodiments thereof as applied to a semiconductor integrated circuit LSI having bipolar transistors of the SICOS, the present invention is not limited thereto in its application. The present invention is applicable also to various types of semiconductor integrated circuits having lines arranged in wiring channel regions arranged in a grid, such as a semiconductor integrated circuit of a gate array system or a standard cell system. It does not matter to the present invention whether the semiconductor integrated circuit employs bipolar transistors or employs MOS field effect transistors as the elementary cells.

The present invention is applicable to a semiconductor integrated circuit such as a so-called printed wiring board principally having wiring lines formed on a silicon substrate, a ceramic substrate or a resin substrate.

The present invention is applicable to semiconductor integrated circuits of a multilayer wiring structure, such as a two-layer wiring structure, a three-layer wiring structure, four-layer wiring structure or a wiring structure consisting of more than four wiring layers.

Fourth Embodiment

Example 1

Figure 37:
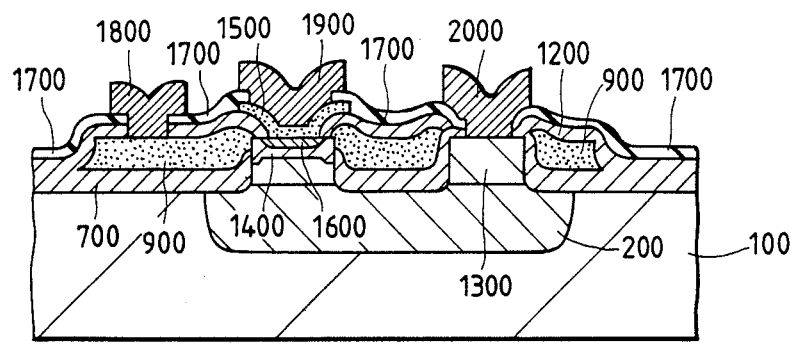
FIG. 37 is a sectional view of an essential portion of a bipolar transistor of SICOS incorporated into a semiconductor integrated circuit, in a fourth embodiment, according to the present invention.

FIG. 37 illustrates an essential portion of a bipolar transistor of the SICOS incorporated into a semiconductor integrated circuit, in a fourth embodiment, according to the present invention.

The fourth embodiment is intended for reducing the steps of the manufacturing process greatly and for smoothing the surface of the element by forming regions of polycrystalline silicon films for forming base electrodes and resistances around all the silicon lands for forming elements.

A method of manufacturing the bipolar transistor shown in FIG. 37 will be described hereinafter with reference to FIGS. 38 through 42.

Figure 38:
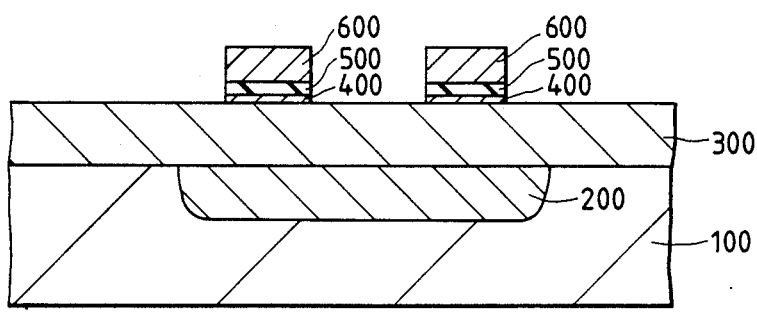
FIGS. 38 through 41 are sectional views of an essential portion of the bipolar transistor of the semiconductor integrated circuit of FIG. 37 in different manufacturing processes.

As shown in FIG. 38, an n+-type diffused layer 200 for forming a collector is formed in a silicon substrate 100, an epitaxial layer 3 is formed over the entire surface of the silicon substrate 100, a silicon dioxide film 400, a silicon nitride film 500 and a CVD silicon dioxide film 600 are formed in that order over the epitaxial layer 300, and then the three layers of the films 400, 500 and 600 are processed by a photoetching process.

Figure 39:
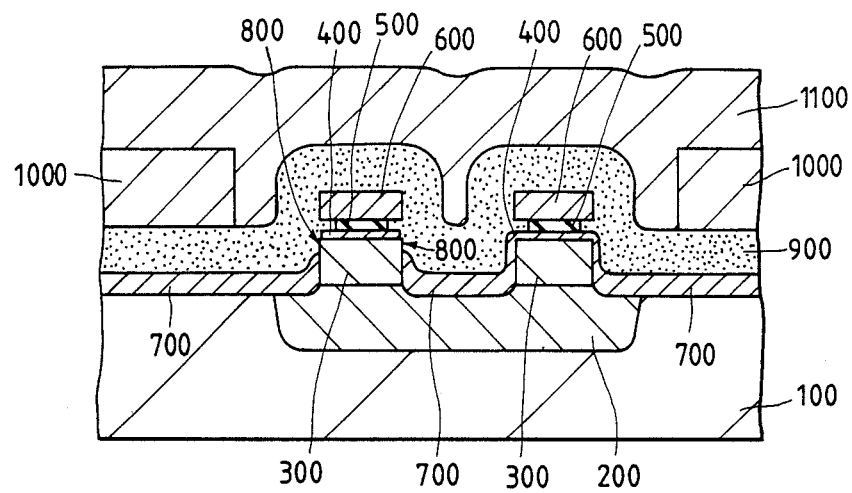

Then, as shown in FIG. 39, an element isolating silicon dioxide film (heat-oxidized silicon dioxide film) 700 and graft base contact holes 8 are formed by a known process for manufacturing a transistor of the SICOS, and then, a polycrystalline silicon film 900 for base electrodes is formed. Then, after doping the polycrystalline silicon film 900 with a p-type impurity, such as boron, a photoresist film 1000 containing a predetermined pattern is formed over a wide cavity in the polycrystalline silicon film 900, and then a photoresistive material is applied to the entire surface of the semifinished semiconductor integrated circuit in a photoresist film 1100 to smooth the same surface.

Figure 40:
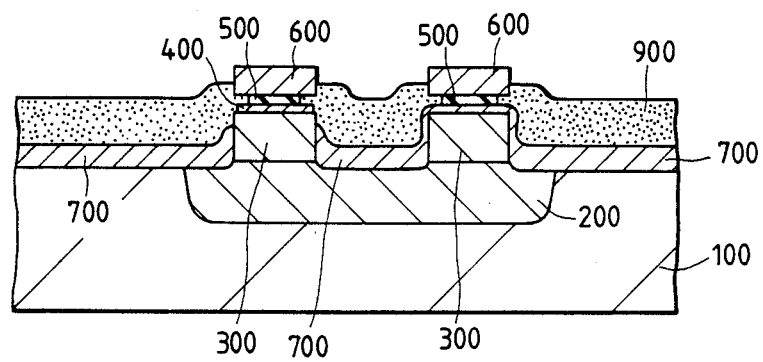

Then, as shown in FIG. 40, the photoresist film 1100 and the polycrystalline silicon film 900 are etched sequentially to remove a portion of the polycrystalline silicon film 900 covering the silicon lands and to smooth the surface face of the semifinished semiconductor integrated circuit.

Figure 41:
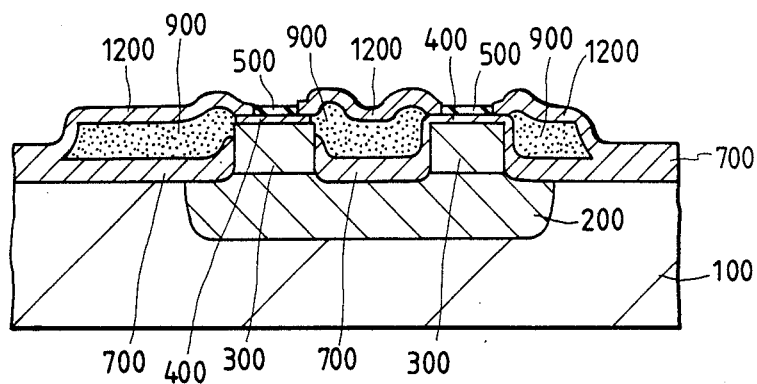

Then, as shown in FIG. 41, the polycrystalline silicon film for base electrodes are patterned so as to surround both the land for forming an emitter and the land for forming the collector, and then the residual portions of the polycrystalline silicon film is subjected to heat oxidation to form a silicon dioxide film 1200.

Then, the silicon nitride film 500 is removed to form a diffused layer 1300 for the collector electrode, and a diffused layer 1400 for the base electrode, and a diffused layer 1600 for the emitter is formed through a polycrystalline silicon film 1500. Then, a passivation film (a silicon nitride film or a PSG film) 1700 is formed, contact holes are formed in the passivation film, and then a base electrode 1800, an emitter electrode 1900 and collector electrode 2000 are formed to complete the bipolar transistor shown in FIG. 37.

Example 2

Example 2 is a modification of the example 1 in the fourth embodiment. The example 2 will be described hereinafter with reference to FIGS. 42 through 45.

Figure 42:
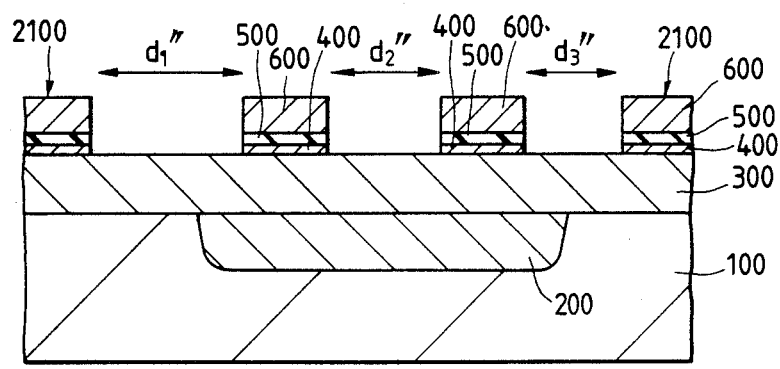
FIGS. 42 through 45 are sectional views of an essential portion of a bipolar transistor incorporated into a modification of the semiconductor integrated circuit of FIG. 37 in different manufacturing processes.

Three layers of films 400, 500 and 600 respectively corresponding to those of the example 1 are formed through the same processes as those employed in forming the example 1 on a substrate 100. As shown in FIG. 42, a dummy pattern 2100 of dummy pedestals is formed outside a transistor forming region. The intervals $d''_1$, $d''_2$ and $d''_3$ between the dummy pedestals are smaller than a predetermined value, for example, 6 μm.

Figure 43:
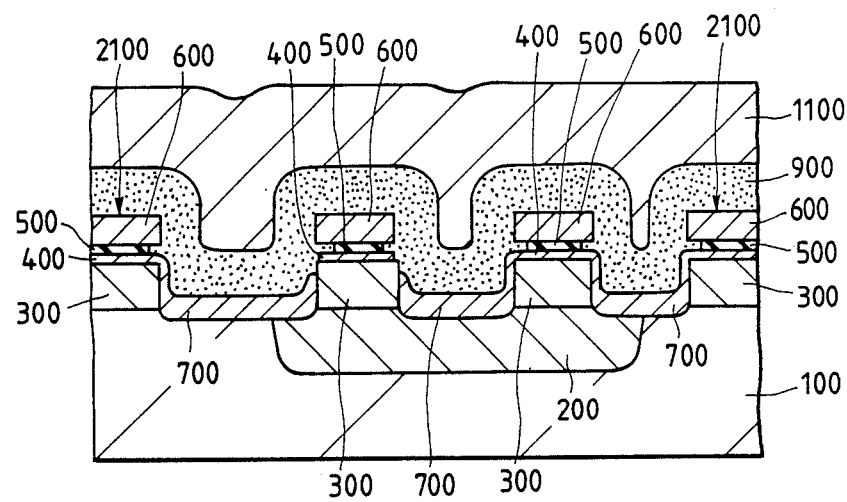

Then, as shown in FIG. 43, an element isolating silicon dioxide film 700 and graft base contact holes 800 are formed by known processes of manufacturing a transistor of the SICOS, and then a polycrystalline silicon film 900 for forming a base electrode is formed. Then, after doping the polycrystalline silicon film 900 with a p-type impurity, a photoresistive material is applied to the entire surface of the substrate 100 to form a photoresist film 1100 having a smooth surface. Since the intervals $d''_1$, $d''_2$ and $d''_3$ are smaller than the predetermined value on the order of 6 μm, any patterned photoresist film, such as the photoresist film 1000 of the example 1, need not be formed in the cavity. The maximum possible value of the intervals $d''_1$, $d''_2$ and $d''_3$ is dependent on photoresistive material applying conditions. Ordinarily, a photoresist film having a smooth surface can be formed by applying a photoresistive material once to the substrate 100 when the intervals are approximately 10 μm, and by applying the same twice to the substrate 100 when the intervals are approximately 30 μm.

Figure 44:
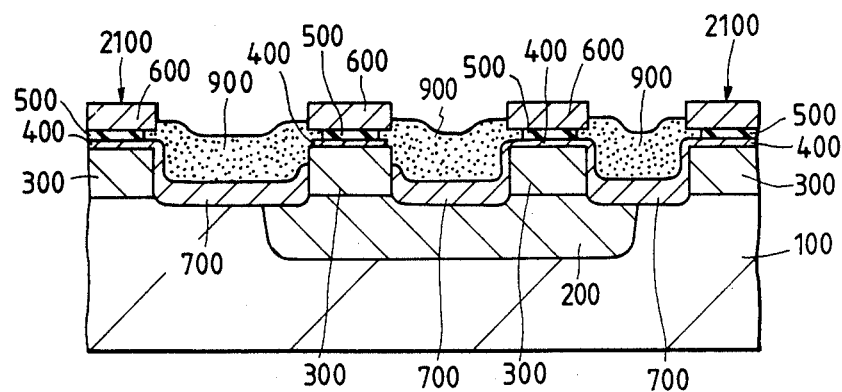

Then, as shown in FIG. 44, the photoresist film 1100 and the polycrystalline silicon film 900 are etched sequentially to smooth the surface of the polycrystalline silicon film 900.

Figure 45:
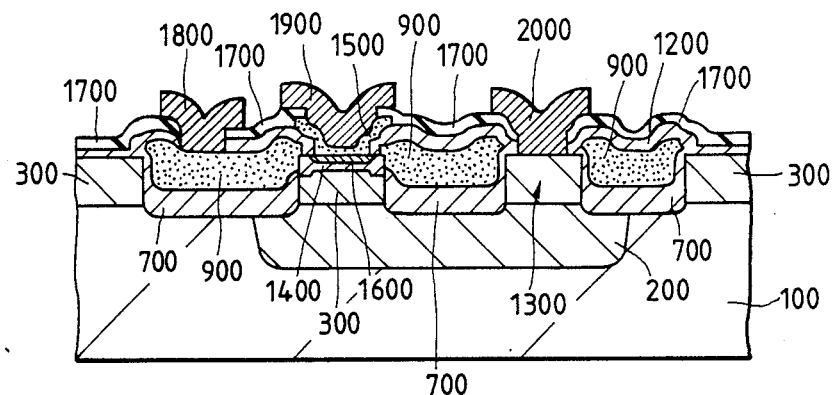

Then, after removing the silicon dioxide film 600, the entire surface of the polycrystalline silicon film 900 is oxidized to form a silicon dioxide film 1200 in the surface of the polycrystalline silicon film 900. Then, the silicon nitride film 500 is removed, the diffused layer 1300 for the collector electrode is formed, the diffused layer 1400 for the base electrode is formed, and then the diffused layer 1600 for the base electrode is formed by using the polycrystalline silicon film 1500. Then, the passivation film 1700 is formed, contact holes are formed respectively at predetermined positions in the passivation film 1700, and then the base electrode 1800, the emitter electrode 1900 and the collector electrode 2000 are formed to complete bipolar transistor as shown in FIG. 45.

Fifth Embodiment

Figure 46:
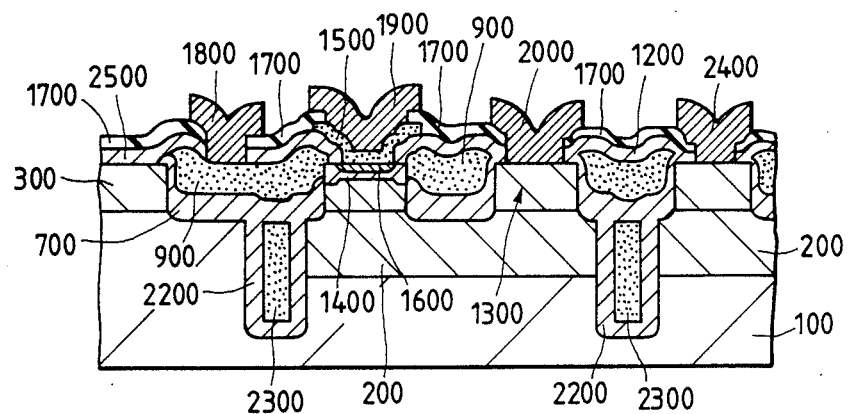
FIG. 46 is a sectional view of an essential portion of a bipolar transistor incorporated into a semiconductor integrated circuit, in a fifth embodiment, according to the present invention.

Isolation of the component elements of the semiconductor integrated circuits in the fourth embodiment of the present invention from each other by means of U-shaped grooves as shown in FIG. 46 is effective for further enhancing the degree of integration of the semiconductor integrated circuits. The use of such U-shaped grooves for isolation reduces the intervals between the component elements to half the ordinary interval. In FIG. 46, indicated at 2200 is a silicon dioxide film, at 2300 is a polycrystalline silicon film, and at 2400 is the collector electrode of the adjacent element. When the capacitance of lines extended over the dummy pedestals matters, portions of the silicon nitride film 500 on the dummy pedestals are removed selectively and a thick silicon dioxide film is formed on the dummy pedestals before oxidizing the surface of the polycrystalline silicon film 900 for the base electrode to reduce the capacitance of the lines effectively.

In the bipolar transistors respectively incorporated into the semiconductor integrated circuits in the fourth and fifth embodiments, the surface of the polycrystalline silicon layer can be oxidized without entailing the reduction of the element forming regions, and hence the size of the elements can further be reduced and variation in the area of the elements is reduced. Consequently, the degree of integration of the semiconductor integrated circuit is increased by approximately 50% and the range of variation of the threshold voltage ($V_{BE}$) of the transistor is reduced by approximately half. Furthermore, since the manufacturing process is simplified remarkably, the yield rate and reliability of the semiconductor integrated circuit is doubled.

As apparent from the foregoing description, portions of the polycrystalline silicon film are left unremoved around the silicon lands for the resistances and for portions for the collector electrodes of the transistors to form the resistances and the regions for the collector electrodes in the same shape as that of the emitter regions, and thereby the oxidation of the silicon substrate in oxidizing the polycrystalline silicon film is prevented. Consequently, the diminution and variation of the area of the regions for forming the elements are reduced remarkably. Furthermore, since a portion of the polycrystalline silicon film extending between the land for the emitter of the transistor and the land for the collector of the same need not be subjected to a photoetching process, the interval between the land for the emitter and the land for the collector can notably reduced, and thereby the elements such as transistors can be formed in a further minute size.

Still further, the surface of the element forming layer can be smoothed simply by forming a photoresist film over the element forming layer by arranging the dummy pedestals at intervals smaller than a predetermined value, whereas, in the conventional method, the element forming layer is smoothed by forming a photoresist film after patterning a photoresist film for filling up wide grooves before etching the polycrystalline silicon film for smoothing. Furthermore, since the base polycrystalline silicon film need not be subjected to a photoetching process when the base polycrystalline film is separated by the dummy pedestals, the height steps in the surface of the semiconductor integrated circuit is reduced and the manufacturing process is simplified.

What is claimed is:

1. A semiconductor integrated circuit device comprising:
    (a) a semiconductor substrate having a main surface;
    (b) first generally parallel wiring channel regions extending in one direction over said main surface, said first wiring channel regions being arranged at a predetermined interval;

(c) second generally parallel wiring channel regions extending in a vertical direction to said one direction over said main surface, said second wiring channel regions being arranged so that said first and second wiring channel regions form a wiring channel grid;

(d) lower layer wirings formed along said wiring channel grid on said main surface, said lower layer wirings being comprised of a first conductive layer;

(e) dummy pedestals comprised of the same conductive layer as that of said lower wirings, said dummy pedestals being formed on said main surface;

(f) an inter-layer insulator film formed over said main surface so as to cover said lower layer wirings and said dummy pedestals; and (g) upper layer wirings formed along said first generally parallel wiring channel regions over said inter-layer insulator film, said upper layer wirings being comprised of a second conductive layer, wherein said dummy pedestals are provided respectively in intersecting areas of said first and second wiring channel regions in which none of said lower layer wirings is placed, and wherein said dummy pedestals are provided at least under areas in which said upper layer wirings are extended.

2. A semiconductor integrated circuit device according to claim 1, wherein said second wiring channel regions are arranged at the same predetermined interval as said first wiring channel regions.

3. A semiconductor integrated circuit device according to claim 1, wherein each of said dummy pedestals has a plane configuration of a square.

4. A semiconductor integrated circuit device according to claim 1, wherein said first and second conductive layers are comprised of a material whose principal component is aluminum.

5. A semiconductor integrated circuit device according to claim 3, wherein adjacent dummy pedestals are arranged at a fixed interval along said one direction and said vertical direction.

6. A semiconductor integrated circuit device according to claim 5, wherein said inter-layer insulator film is formed so as to bury gaps between said adjacent dummy pedestals.

7. A semiconductor integrated circuit device according to claim 6, wherein said inter-layer insulator film is comprised of a silicon dioxide film.

8. A semiconductor integrated circuit device according to claim 1, wherein said lower layer wirings, said dummy pedestals and upper layer wirings are arranged by a computer-aided automatic wiring layout system.

9. A semiconductor integrated circuit device according to claim 1, wherein said dummy pedestals are electrically isolated from each other and from said lower layer wirings.

10. A semiconductor integrated circuit device according to claim 9, wherein each of said dummy pedestals is in a floating state electrically.

11. A semiconductor integrated circuit device comprising:

(a) a semiconductor substrate having a main surface;

(b) first generally parallel imaginary lines extending in one direction over said main surface, said first lines being imaginarily formed by a computer-aided design system and being arranged at a predetermined interval;

(c) second generally parallel imaginary lines extending in a vertical direction to said one direction over said main surface, said second lines being imaginarily formed by said system and being arranged so that said first and second lines form an imaginary grid;

(d) lower layer wirings formed along said imaginary grid on said main surface, said lower layer wirings being comprised of a first conductive layer;

(e) dummy pedestals comprised of the same conductive layer as that of said lower layer wirings, said dummy pedestals being formed on said main surface;

(f) an inter-layer insulator film formed over said main surface so as to cover said lower layer wirings and said dummy pedestals; and (g) upper layer wirings formed along said first generally parallel imaginary lines over said inter-layer insulator film, said upper layer wirings being comprised of a second conductive layer, wherein said dummy pedestals are provided respectively in intersecting portions of said first and second lines in which none of said lower layer wirings is placed, and wherein said dummy pedestals are provided at least under areas in which said upper layer wirings are extended.

12. A semiconductor integrated circuit device according to claim 11, wherein each of said dummy pedestals has a plane configuration of a square.

13. A semiconductor integrated circuit device according to claim 12, wherein said first and second conductive layers are comprised of a material whose principal component is aluminum.

14. A semiconductor integrated circuit device according to claim 12, wherein adjacent dummy pedestals are arranged at a fixed interval along said one direction and said vertical direction.

15. A semiconductor integrated circuit device according to claim 14, wherein said inter-layer insulator film is formed so as to bury gaps between said adjacent dummy pedestals.

16. A semiconductor integrated circuit device according to claim 15, wherein said inter-layer insulator film is comprised of a silicon dioxide film.

17. A semiconductor integrated circuit device according to claim 11, wherein said lower layer wirings, said dummy pedestals and upper layer wirings are arranged by a computer-aided design system.

18. A semiconductor integrated circuit device according to claim 11, wherein said dummy pedestals are electrically isolated from each other and from the lower layer wirings.

19. A semiconductor integrated circuit device according to claim 18, wherein each of said dummy pedestals is in a floating state electrically.

20. A semiconductor integrated circuit device according to claim 11, wherein said second parallel imaginary lines are arranged at the same predetermined interval as said first parallel imaginary lines.

21. A semiconductor integrated circuit device comprising:

(a) a semiconductor substrate having a main surface;

(b) lower layer wirings comprised of a first conductive layer formed on said main surface;

(c) a plurality of dummy pedestals comprised of the same layer as said first conductive layer formed between said lower layer wirings on said main surface, each of said dummy pedestals having a plane configuration which is substantially square, adjacent ones of said dummy pedestals being spaced at a predetermined interval;

(d) an inter-layer insulator film formed over said main surface so as to cover said lower layer wirings and said dummy pedestals; and (e) upper layer wirings comprised of a second conductive layer formed on said inter-layer insulator film, said upper layer wirings being extended over areas in which said dummy pedestals are formed.

* * * * *